United States Patent
Karnstedt et al.

(10) Patent No.: US 10,141,788 B2
(45) Date of Patent: Nov. 27, 2018

(54) DYNAMIC TUNING IN WIRELESS ENERGY TRANSFER SYSTEMS

(71) Applicant: WiTricity Corporation, Watertown, MA (US)

(72) Inventors: Curt Karnstedt, Austin, TX (US); Christopher Buenrostro, Lexington, MA (US)

(73) Assignee: WiTricity Corporation, Watertown, MA (US)

( * ) Notice: Subject to any disclaimer, the term of this patent is extended or adjusted under 35 U.S.C. 154(b) by 10 days.

(21) Appl. No.: 15/293,443

(22) Filed: Oct. 14, 2016

(65) Prior Publication Data

US 2017/0117751 A1    Apr. 27, 2017

Related U.S. Application Data

(60) Provisional application No. 62/244,799, filed on Oct. 22, 2015.

(51) Int. Cl.
*H01F 27/42* (2006.01)
*H01F 37/00* (2006.01)
(Continued)

(52) U.S. Cl.
CPC .............. *H02J 50/12* (2016.02); *H02J 7/025* (2013.01); *H02J 50/60* (2016.02); *H02J 50/90* (2016.02); *H03H 7/40* (2013.01); *H04B 5/0037* (2013.01)

(58) Field of Classification Search
CPC .. H02J 50/12; H02J 50/60; H02J 50/90; H02J 7/02; H02J 7/025; H03H 7/38; H03H 7/40; H05H 1/24; H02M 3/06
(Continued)

(56) References Cited

U.S. PATENT DOCUMENTS 645,576 A    3/1900 Tesla
649,621 A    5/1900 Tesla
(Continued)

FOREIGN PATENT DOCUMENTS

CA    142352    8/1912
CN    102239633    11/2011
(Continued)

OTHER PUBLICATIONS

"Intel CTO Says Gap between Humans, Machines Will Close by 2050", *Intel News Release*, (See intel.com/ . . . /20080821comp. htm?iid=S . . . ) (Printed Nov. 6, 2009).
(Continued)

*Primary Examiner* — Rexford Barnie
*Assistant Examiner* — Jagdeep Dhillon
(74) *Attorney, Agent, or Firm* — Fish & Richardson P.C.

(57) ABSTRACT

Methods, systems, and apparatus, including computer programs encoded on a computer storage medium, for dynamically tuning circuit elements. One aspect includes a variable capacitance device. The device includes a first capacitor, a first switch, a second capacitor, a second switch, and control circuitry. The control circuitry is configured to adjust respective capacitances of the first and second capacitors by causing a first control signal to be applied to the first-switch control terminal for a duration of time in response to detecting a zero voltage condition across the first switch, and by causing a second control signal to be applied to the second-switch control terminal for the duration of time in response to detecting a zero voltage condition across the second switch.

18 Claims, 14 Drawing Sheets

(51) Int. Cl.
  *H01F 38/00* (2006.01)
  *H02J 50/12* (2016.01)
  *H02J 50/60* (2016.01)
  *H02J 50/90* (2016.01)
  *H02J 7/02* (2016.01)
  *H03H 7/40* (2006.01)
  *H04B 5/00* (2006.01)

(58) Field of Classification Search
  USPC .......... 307/104, 43, 82, 66, 64, 9.1, 10.1, 31
  See application file for complete search history.

(56) References Cited

U.S. PATENT DOCUMENTS

| | | | |
|---|---|---|---|
| 787,412 A | 4/1905 | Tesla | |
| 1,119,732 A | 12/1914 | Tesla | |
| 2,133,494 A | 10/1938 | Waters | |
| 3,517,350 A | 6/1970 | Beaver | |
| 3,535,543 A | 10/1970 | Dailey | |
| 3,780,425 A | 12/1973 | Penn et al. | |
| 3,871,176 A | 3/1975 | Schukei | |
| 4,088,999 A | 5/1978 | Fletcher et al. | |
| 4,095,998 A | 6/1978 | Hanson | |
| 4,180,795 A | 12/1979 | Matsuda et al. | |
| 4,280,129 A | 7/1981 | Wells | |
| 4,450,431 A | 5/1984 | Hochstein | |
| 4,588,978 A | 5/1986 | Allen | |
| 5,027,709 A | 7/1991 | Slagle | |
| 5,033,295 A | 7/1991 | Schmid et al. | |
| 5,034,658 A | 7/1991 | Hiering et al. | |
| 5,053,774 A | 10/1991 | Schuermann et al. | |
| 5,070,293 A | 12/1991 | Ishii et al. | |
| 5,118,997 A | 6/1992 | El-Hamamsy | |
| 5,216,402 A | 6/1993 | Carosa | |
| 5,229,652 A | 7/1993 | Hough | |
| 5,287,112 A | 2/1994 | Schuermann | |
| 5,341,083 A | 8/1994 | Klontz et al. | |
| 5,367,242 A | 11/1994 | Hulman | |
| 5,374,930 A | 12/1994 | Schuermann | |
| 5,408,209 A | 4/1995 | Tanzer et al. | |
| 5,437,057 A | 7/1995 | Richley et al. | |
| 5,455,467 A | 10/1995 | Young et al. | |
| 5,493,691 A | 2/1996 | Barrett | |
| 5,522,856 A | 6/1996 | Reineman | |
| 5,528,113 A | 6/1996 | Boys et al. | |
| 5,541,604 A | 7/1996 | Meier | |
| 5,550,452 A | 8/1996 | Shirai et al. | |
| 5,565,763 A | 10/1996 | Arrendale et al. | |
| 5,630,835 A | 5/1997 | Brownlee | |
| 5,697,956 A | 12/1997 | Bornzin | |
| 5,703,461 A | 12/1997 | Minoshima et al. | |
| 5,703,573 A | 12/1997 | Fujimoto et al. | |
| 5,710,413 A | 1/1998 | King et al. | |
| 5,742,471 A | 4/1998 | Barbee, Jr. et al. | |
| 5,821,728 A | 10/1998 | Sshwind | |
| 5,821,731 A | 10/1998 | Kuki et al. | |
| 5,864,323 A | 1/1999 | Berthon | |
| 5,898,579 A | 4/1999 | Boys et al. | |
| 5,903,134 A | 5/1999 | Takeuchi | |
| 5,923,544 A | 7/1999 | Urano | |
| 5,940,509 A | 8/1999 | Jovanovich et al. | |
| 5,957,956 A | 9/1999 | Kroll et al. | |
| 5,959,245 A | 9/1999 | Moe et al. | |
| 5,986,895 A | 11/1999 | Stewart et al. | |
| 5,993,996 A | 11/1999 | Firsich | |
| 5,999,308 A | 12/1999 | Nelson et al. | |
| 6,012,659 A | 1/2000 | Nakazawa et al. | |
| 6,047,214 A | 4/2000 | Mueller et al. | |
| 6,066,163 A | 5/2000 | John | |
| 6,067,473 A | 5/2000 | Greeninger et al. | |
| 6,108,579 A | 8/2000 | Snell et al. | |
| 6,127,799 A | 10/2000 | Krishnan | |
| 6,176,433 B1 | 1/2001 | Uesaka et al. | |
| 6,184,651 B1 | 2/2001 | Fernandez et al. | |
| 6,207,887 B1 | 3/2001 | Bass et al. | |
| 6,232,841 B1 | 5/2001 | Bartlett et al. | |
| 6,238,387 B1 | 5/2001 | Miller, III | |
| 6,252,762 B1 | 6/2001 | Amatucci | |
| 6,436,299 B1 | 8/2002 | Baarman et al. | |
| 6,450,946 B1 | 9/2002 | Forsell | |
| 6,452,465 B1 | 9/2002 | Brown et al. | |
| 6,459,218 B2 | 10/2002 | Boys et al. | |
| 6,473,028 B1 | 10/2002 | Luc | |
| 6,483,202 B1 | 11/2002 | Boys | |
| 6,486,838 B1 * | 11/2002 | Smith | G01R 33/441 324/300 |
| 6,515,878 B1 | 2/2003 | Meins et al. | |
| 6,535,133 B2 | 3/2003 | Gohara | |
| 6,561,975 B1 | 5/2003 | Pool et al. | |
| 6,563,425 B2 | 5/2003 | Nicholson et al. | |
| 6,597,076 B2 | 7/2003 | Scheible et al. | |
| 6,609,023 B1 | 8/2003 | Fischell et al. | |
| 6,631,072 B1 | 10/2003 | Paul et al. | |
| 6,650,227 B1 | 11/2003 | Bradin | |
| 6,664,770 B1 | 12/2003 | Bartels | |
| 6,673,250 B2 | 1/2004 | Kuennen et al. | |
| 6,683,256 B2 | 1/2004 | Kao | |
| 6,696,647 B2 | 2/2004 | Ono et al. | |
| 6,703,921 B1 | 3/2004 | Wuidart et al. | |
| 6,731,071 B2 | 5/2004 | Baarman | |
| 6,749,119 B2 | 6/2004 | Scheible et al. | |
| 6,772,011 B2 | 8/2004 | Dolgin | |
| 6,798,716 B1 | 9/2004 | Charych | |
| 6,803,744 B1 | 10/2004 | Sabo | |
| 6,806,649 B2 | 10/2004 | Mollema et al. | |
| 6,812,645 B2 | 11/2004 | Baarman | |
| 6,825,620 B2 | 11/2004 | Kuennen et al. | |
| 6,831,417 B2 | 12/2004 | Baarman | |
| 6,839,035 B1 | 1/2005 | Addonisio et al. | |
| 6,844,702 B2 | 1/2005 | Giannopoulos et al. | |
| 6,856,291 B2 | 2/2005 | Mickle et al. | |
| 6,858,970 B2 | 2/2005 | Malkin et al. | |
| 6,906,495 B2 | 6/2005 | Cheng et al. | |
| 6,917,163 B2 | 7/2005 | Baarman | |
| 6,917,431 B2 | 7/2005 | Soljacic et al. | |
| 6,937,130 B2 | 8/2005 | Scheible et al. | |
| 6,960,968 B2 | 11/2005 | Odendaal et al. | |
| 6,961,619 B2 | 11/2005 | Casey | |
| 6,967,462 B1 | 11/2005 | Landis | |
| 6,975,198 B2 | 12/2005 | Baarman | |
| 6,988,026 B2 | 1/2006 | Breed et al. | |
| 7,027,311 B2 | 4/2006 | Vanderelli et al. | |
| 7,035,076 B1 | 4/2006 | Stevenson | |
| 7,042,196 B2 | 5/2006 | Ka-Lai et al. | |
| 7,069,064 B2 | 6/2006 | Govorgian et al. | |
| 7,084,605 B2 | 8/2006 | Mickle et al. | |
| 7,116,200 B2 | 10/2006 | Baarman et al. | |
| 7,118,240 B2 | 10/2006 | Baarman et al. | |
| 7,126,450 B2 | 10/2006 | Baarman et al. | |
| 7,127,293 B2 | 10/2006 | MacDonald | |
| 7,132,918 B2 | 11/2006 | Baarman et al. | |
| 7,147,604 B1 | 12/2006 | Allen et al. | |
| 7,180,248 B2 | 2/2007 | Kuennen et al. | |
| 7,191,007 B2 | 3/2007 | Desai et al. | |
| 7,193,418 B2 | 3/2007 | Freytag | |
| D541,322 S | 4/2007 | Garrett et al. | |
| 7,212,414 B2 | 5/2007 | Baarman | |
| 7,233,137 B2 | 6/2007 | Nakamura et al. | |
| D545,855 S | 7/2007 | Garrett et al. | |
| 7,239,110 B2 | 7/2007 | Cheng et al. | |
| 7,248,017 B2 | 7/2007 | Cheng et al. | |
| 7,251,527 B2 | 7/2007 | Lyden | |
| 7,288,918 B2 | 10/2007 | DiStefano | |
| 7,340,304 B2 | 3/2008 | MacDonald | |
| 7,375,492 B2 | 5/2008 | Calhoon et al. | |
| 7,375,493 B2 | 5/2008 | Calhoon et al. | |
| 7,378,817 B2 | 5/2008 | Calhoon et al. | |
| 7,382,636 B2 | 6/2008 | Baarman et al. | |
| 7,385,357 B2 | 6/2008 | Kuennen et al. | |
| 7,443,135 B2 | 10/2008 | Cho | |
| 7,462,951 B1 | 12/2008 | Baarman | |
| 7,466,213 B2 | 12/2008 | Lobl et al. | |
| 7,471,062 B2 | 12/2008 | Bruning | |
| 7,474,058 B2 | 1/2009 | Baarman | |

(56) References Cited

U.S. PATENT DOCUMENTS

| | | | |
|---|---|---|---|
| 7,492,247 B2 | 2/2009 | Schmidt et al. | |
| 7,514,818 B2 | 4/2009 | Abe et al. | |
| 7,518,267 B2 | 4/2009 | Baarman | |
| 7,521,890 B2 | 4/2009 | Lee et al. | |
| 7,525,283 B2 | 4/2009 | Cheng et al. | |
| 7,545,337 B2 | 6/2009 | Guenther | |
| 7,554,316 B2 | 6/2009 | Stevens et al. | |
| 7,599,743 B2 | 10/2009 | Hassler, Jr. et al. | |
| 7,615,936 B2 | 11/2009 | Baarman et al. | |
| 7,639,514 B2 | 12/2009 | Baarman | |
| 7,741,734 B2 | 6/2010 | Joannopoulos et al. | |
| 7,795,708 B2 | 9/2010 | Katti | |
| 7,800,458 B2 * | 9/2010 | Shin | H03B 5/1852 331/117 FE |
| 7,825,543 B2 | 11/2010 | Karalis et al. | |
| 7,825,544 B2 | 11/2010 | Jansen et al. | |
| 7,835,417 B2 | 11/2010 | Heideman et al. | |
| 7,843,288 B2 | 11/2010 | Lee et al. | |
| 7,844,306 B2 | 11/2010 | Shearer et al. | |
| 7,863,859 B2 | 1/2011 | Soar | |
| 7,880,337 B2 | 2/2011 | Farkas | |
| 7,884,697 B2 | 2/2011 | Wei et al. | |
| 7,885,050 B2 | 2/2011 | Lee | |
| 7,919,886 B2 | 4/2011 | Tanaka | |
| 7,923,870 B2 | 4/2011 | Jin | |
| 7,932,798 B2 | 4/2011 | Tolle et al. | |
| 7,948,209 B2 | 5/2011 | Jung | |
| 7,952,322 B2 | 5/2011 | Partovi et al. | |
| 7,963,941 B2 | 6/2011 | Wilk | |
| 7,969,045 B2 | 6/2011 | Schmidt et al. | |
| 7,994,880 B2 | 8/2011 | Chen et al. | |
| 7,999,506 B1 | 8/2011 | Hollar et al. | |
| 8,022,576 B2 | 9/2011 | Joannopoulos et al. | |
| 8,035,255 B2 | 10/2011 | Kurs et al. | |
| 8,076,800 B2 | 12/2011 | Joannopoulos et al. | |
| 8,076,801 B2 | 12/2011 | Karalis et al. | |
| 8,084,889 B2 | 12/2011 | Joannopoulos et al. | |
| 8,097,983 B2 | 1/2012 | Karalis et al. | |
| 8,106,539 B2 | 1/2012 | Schatz et al. | |
| 8,115,448 B2 | 2/2012 | John | |
| 8,131,378 B2 | 3/2012 | Greenberg et al. | |
| 8,178,995 B2 | 5/2012 | Amano et al. | |
| 8,193,769 B2 | 6/2012 | Azancot et al. | |
| 8,212,414 B2 | 7/2012 | Howard et al. | |
| 8,260,200 B2 | 9/2012 | Shimizu et al. | |
| 8,304,935 B2 | 11/2012 | Karalis et al. | |
| 8,324,759 B2 | 12/2012 | Karalis et al. | |
| 8,334,620 B2 | 12/2012 | Park et al. | |
| 8,362,651 B2 | 1/2013 | Hamam et al. | |
| 8,395,282 B2 | 3/2013 | Joannopoulos et al. | |
| 8,395,283 B2 | 3/2013 | Joannopoulos et al. | |
| 8,400,017 B2 | 3/2013 | Kurs et al. | |
| 8,400,018 B2 | 3/2013 | Joannopoulos et al. | |
| 8,400,019 B2 | 3/2013 | Joannopoulos et al. | |
| 8,400,020 B2 | 3/2013 | Joannopoulos et al. | |
| 8,400,021 B2 | 3/2013 | Joannopoulos et al. | |
| 8,400,022 B2 | 3/2013 | Joannopoulos et al. | |
| 8,400,023 B2 | 3/2013 | Joannopoulos et al. | |
| 8,400,024 B2 | 3/2013 | Joannopoulos et al. | |
| 8,410,636 B2 | 4/2013 | Kurs et al. | |
| 8,441,154 B2 | 5/2013 | Karalis et al. | |
| 8,457,547 B2 | 6/2013 | Meskens | |
| 8,461,719 B2 | 6/2013 | Kesler et al. | |
| 8,461,720 B2 | 6/2013 | Kurs et al. | |
| 8,461,721 B2 | 6/2013 | Karalis et al. | |
| 8,461,722 B2 | 6/2013 | Kurs et al. | |
| 8,461,817 B2 | 6/2013 | Martin et al. | |
| 8,466,583 B2 | 6/2013 | Karalis et al. | |
| 8,471,410 B2 | 6/2013 | Karalis et al. | |
| 8,476,788 B2 | 7/2013 | Karalis et al. | |
| 8,482,157 B2 | 7/2013 | Cook et al. | |
| 8,482,158 B2 | 7/2013 | Kurs et al. | |
| 8,487,480 B1 | 7/2013 | Kesler et al. | |
| 8,497,601 B2 | 7/2013 | Hall et al. | |
| 8,552,592 B2 | 10/2013 | Schatz et al. | |
| 8,569,914 B2 | 10/2013 | Karalis et al. | |
| 8,587,153 B2 | 11/2013 | Schatz et al. | |
| 8,587,155 B2 | 11/2013 | Giler et al. | |
| 8,598,743 B2 | 12/2013 | Hall et al. | |
| 8,618,696 B2 | 12/2013 | Karalis et al. | |
| 8,629,578 B2 | 1/2014 | Kurs et al. | |
| 8,643,326 B2 | 2/2014 | Campanella et al. | |
| 9,081,038 B2 * | 7/2015 | Spalding, Jr. | G01R 15/06 |
| 2002/0032471 A1 | 3/2002 | Loftin et al. | |
| 2002/0105343 A1 | 8/2002 | Scheible et al. | |
| 2002/0118004 A1 | 8/2002 | Scheible et al. | |
| 2002/0130642 A1 | 9/2002 | Ettes et al. | |
| 2002/0167294 A1 | 11/2002 | Odaohhara | |
| 2003/0038641 A1 | 2/2003 | Scheible | |
| 2003/0062794 A1 | 4/2003 | Scheible et al. | |
| 2003/0062980 A1 | 4/2003 | Scheible et al. | |
| 2003/0071034 A1 | 4/2003 | Thompson et al. | |
| 2003/0124050 A1 | 7/2003 | Yadav et al. | |
| 2003/0126948 A1 | 7/2003 | Yadav et al. | |
| 2003/0160590 A1 | 8/2003 | Schaefer et al. | |
| 2003/0199778 A1 | 10/2003 | Mickle et al. | |
| 2003/0214255 A1 | 11/2003 | Baarman et al. | |
| 2004/0000974 A1 | 1/2004 | Odenaal et al. | |
| 2004/0026998 A1 | 2/2004 | Henriott et al. | |
| 2004/0100338 A1 | 5/2004 | Clark | |
| 2004/0113847 A1 | 6/2004 | Qi et al. | |
| 2004/0130425 A1 | 7/2004 | Dayan et al. | |
| 2004/0130915 A1 | 7/2004 | Baarman | |
| 2004/0130916 A1 | 7/2004 | Baarman | |
| 2004/0142733 A1 | 7/2004 | Parise | |
| 2004/0150934 A1 | 8/2004 | Baarman | |
| 2004/0189246 A1 | 9/2004 | Bulai et al. | |
| 2004/0201361 A1 | 10/2004 | Koh et al. | |
| 2004/0222751 A1 | 11/2004 | Mollema et al. | |
| 2004/0227057 A1 | 11/2004 | Tuominen et al. | |
| 2004/0232845 A1 | 11/2004 | Baarman | |
| 2004/0233043 A1 | 11/2004 | Yazawa et al. | |
| 2004/0267501 A1 | 12/2004 | Freed et al. | |
| 2005/0007067 A1 | 1/2005 | Baarman et al. | |
| 2005/0021134 A1 | 1/2005 | Opie | |
| 2005/0027192 A1 | 2/2005 | Govari et al. | |
| 2005/0033382 A1 | 2/2005 | Single | |
| 2005/0085873 A1 | 4/2005 | Gord et al. | |
| 2005/0093475 A1 | 5/2005 | Kuennen et al. | |
| 2005/0104064 A1 | 5/2005 | Hegarty et al. | |
| 2005/0104453 A1 | 5/2005 | Vanderelli et al. | |
| 2005/0116650 A1 | 6/2005 | Baarman | |
| 2005/0116683 A1 | 6/2005 | Cheng et al. | |
| 2005/0122058 A1 | 6/2005 | Baarman et al. | |
| 2005/0122059 A1 | 6/2005 | Baarman et al. | |
| 2005/0125093 A1 | 6/2005 | Kikuchi et al. | |
| 2005/0127849 A1 | 6/2005 | Baarman et al. | |
| 2005/0127850 A1 | 6/2005 | Baarman et al. | |
| 2005/0127866 A1 | 6/2005 | Hamilton et al. | |
| 2005/0135122 A1 | 6/2005 | Cheng et al. | |
| 2005/0140482 A1 | 6/2005 | Cheng et al. | |
| 2005/0151511 A1 | 7/2005 | Chary | |
| 2005/0156560 A1 | 7/2005 | Shimaoka et al. | |
| 2005/0189945 A1 | 9/2005 | Reiderman | |
| 2005/0194926 A1 | 9/2005 | DiStefano | |
| 2005/0253152 A1 | 11/2005 | Klimov et al. | |
| 2005/0288739 A1 | 12/2005 | Hassler, Jr. et al. | |
| 2005/0288740 A1 | 12/2005 | Hassler, Jr. et al. | |
| 2005/0288741 A1 | 12/2005 | Hassler, Jr. et al. | |
| 2005/0288742 A1 | 12/2005 | Giordano et al. | |
| 2006/0001509 A1 | 1/2006 | Gibbs | |
| 2006/0010902 A1 | 1/2006 | Trinh et al. | |
| 2006/0022636 A1 | 2/2006 | Xian et al. | |
| 2006/0053296 A1 | 3/2006 | Busboom et al. | |
| 2006/0061323 A1 | 3/2006 | Cheng et al. | |
| 2006/0066443 A1 | 3/2006 | Hall | |
| 2006/0090956 A1 | 5/2006 | Peshkovskiy et al. | |
| 2006/0132045 A1 | 6/2006 | Baarman | |
| 2006/0164866 A1 | 7/2006 | Vanderelli et al. | |
| 2006/0181242 A1 | 8/2006 | Freed et al. | |
| 2006/0184209 A1 | 8/2006 | John et al. | |
| 2006/0184210 A1 | 8/2006 | Singhal et al. | |
| 2006/0185809 A1 | 8/2006 | Elfrink et al. | |
| 2006/0199620 A1 | 9/2006 | Greene et al. | |

(56) References Cited

U.S. PATENT DOCUMENTS

| | | |
|---|---|---|
| 2006/0202665 A1 | 9/2006 | Hsu |
| 2006/0205381 A1 | 9/2006 | Beart et al. |
| 2006/0214626 A1 | 9/2006 | Nilson et al. |
| 2006/0219448 A1 | 10/2006 | Grieve et al. |
| 2006/0238365 A1 | 10/2006 | Vecchione et al. |
| 2006/0270440 A1 | 11/2006 | Shearer et al. |
| 2006/0281435 A1 | 12/2006 | Shearer et al. |
| 2007/0010295 A1 | 1/2007 | Greene et al. |
| 2007/0013483 A1 | 1/2007 | Stewart |
| 2007/0016089 A1 | 1/2007 | Fischell et al. |
| 2007/0021140 A1 | 1/2007 | Keyes, IV et al. |
| 2007/0024246 A1 | 2/2007 | Flaugher |
| 2007/0064406 A1 | 3/2007 | Beart |
| 2007/0069687 A1 | 3/2007 | Suzuki |
| 2007/0096875 A1 | 5/2007 | Waterhouse et al. |
| 2007/0105429 A1 | 5/2007 | Kohl et al. |
| 2007/0117596 A1 | 5/2007 | Greene et al. |
| 2007/0126650 A1 | 6/2007 | Guenther |
| 2007/0145830 A1 | 6/2007 | Lee et al. |
| 2007/0164839 A1 | 7/2007 | Naito |
| 2007/0171681 A1 | 7/2007 | Baarman |
| 2007/0176840 A1 | 8/2007 | Pristas et al. |
| 2007/0178945 A1 | 8/2007 | Cook et al. |
| 2007/0182367 A1 | 8/2007 | Partovi |
| 2007/0208263 A1 | 9/2007 | John et al. |
| 2007/0222542 A1 | 9/2007 | Joannopoulos et al. |
| 2007/0257636 A1 | 11/2007 | Phillips et al. |
| 2007/0267918 A1 | 11/2007 | Gyland |
| 2007/0276538 A1 | 11/2007 | Kjellsson et al. |
| 2008/0012569 A1 | 1/2008 | Hall et al. |
| 2008/0014897 A1 | 1/2008 | Cook et al. |
| 2008/0030415 A1 | 2/2008 | Homan et al. |
| 2008/0036588 A1 | 2/2008 | Iverson et al. |
| 2008/0047727 A1 | 2/2008 | Sexton et al. |
| 2008/0051854 A1 | 2/2008 | Bulkes et al. |
| 2008/0067874 A1 | 3/2008 | Tseng |
| 2008/0132909 A1 | 6/2008 | Jascob et al. |
| 2008/0154331 A1 | 6/2008 | John et al. |
| 2008/0176521 A1 | 7/2008 | Singh et al. |
| 2008/0191638 A1 | 8/2008 | Kuennen et al. |
| 2008/0197710 A1 | 8/2008 | Kreitz et al. |
| 2008/0197802 A1 | 8/2008 | Onishi et al. |
| 2008/0211320 A1 | 9/2008 | Cook et al. |
| 2008/0238364 A1 | 10/2008 | Weber et al. |
| 2008/0255901 A1 | 10/2008 | Carroll et al. |
| 2008/0265684 A1 | 10/2008 | Farkas |
| 2008/0266748 A1 | 10/2008 | Lee |
| 2008/0272860 A1 | 11/2008 | Pance |
| 2008/0273242 A1 | 11/2008 | Woodgate et al. |
| 2008/0278264 A1 | 11/2008 | Karalis et al. |
| 2008/0291277 A1 | 11/2008 | Jacobsen et al. |
| 2008/0300657 A1 | 12/2008 | Stultz |
| 2008/0300660 A1 | 12/2008 | John |
| 2009/0010028 A1 | 1/2009 | Baarmen et al. |
| 2009/0015075 A1 | 1/2009 | Cook et al. |
| 2009/0033280 A1 | 2/2009 | Choi et al. |
| 2009/0033564 A1 | 2/2009 | Cook et al. |
| 2009/0038623 A1 | 2/2009 | Farbarik et al. |
| 2009/0045772 A1 | 2/2009 | Cook et al. |
| 2009/0051224 A1 | 2/2009 | Cook et al. |
| 2009/0058189 A1 | 3/2009 | Cook et al. |
| 2009/0058361 A1 | 3/2009 | John |
| 2009/0067198 A1 | 3/2009 | Graham et al. |
| 2009/0072627 A1 | 3/2009 | Cook et al. |
| 2009/0072628 A1 | 3/2009 | Cook et al. |
| 2009/0072629 A1 | 3/2009 | Cook et al. |
| 2009/0072782 A1 | 3/2009 | Randall |
| 2009/0079268 A1 | 3/2009 | Cook et al. |
| 2009/0079387 A1 | 3/2009 | Jin et al. |
| 2009/0085408 A1 | 4/2009 | Bruhn |
| 2009/0085706 A1 | 4/2009 | Baarman et al. |
| 2009/0096413 A1 | 4/2009 | Patovi et al. |
| 2009/0102292 A1 | 4/2009 | Cook et al. |
| 2009/0108679 A1 | 4/2009 | Porwal |
| 2009/0108997 A1 | 4/2009 | Patterson et al. |
| 2009/0115628 A1 | 5/2009 | Dicks et al. |
| 2009/0127937 A1 | 5/2009 | Widmer et al. |
| 2009/0134712 A1 | 5/2009 | Cook et al. |
| 2009/0146892 A1 | 6/2009 | Shimizu et al. |
| 2009/0153273 A1 | 6/2009 | Chen |
| 2009/0160261 A1 | 6/2009 | Elo |
| 2009/0161078 A1 | 6/2009 | Wu et al. |
| 2009/0167449 A1 | 7/2009 | Cook et al. |
| 2009/0174263 A1 | 7/2009 | Baarman et al. |
| 2009/0179502 A1 | 7/2009 | Cook et al. |
| 2009/0188396 A1 | 7/2009 | Hofmann et al. |
| 2009/0189458 A1 | 7/2009 | Kawasaki |
| 2009/0195332 A1 | 8/2009 | Joannopoulos et al. |
| 2009/0195333 A1 | 8/2009 | Joannopoulos et al. |
| 2009/0212636 A1 | 8/2009 | Cook et al. |
| 2009/0213028 A1 | 8/2009 | Cook et al. |
| 2009/0218884 A1 | 9/2009 | Soar |
| 2009/0224608 A1 | 9/2009 | Cook et al. |
| 2009/0224609 A1 | 9/2009 | Cook et al. |
| 2009/0224723 A1 | 9/2009 | Tanabe |
| 2009/0224856 A1 | 9/2009 | Karalis et al. |
| 2009/0230777 A1 | 9/2009 | Baarman et al. |
| 2009/0237194 A1 | 9/2009 | Waffenschmidt et al. |
| 2009/0243394 A1 | 10/2009 | Levine |
| 2009/0243397 A1 | 10/2009 | Cook et al. |
| 2009/0251008 A1 | 10/2009 | Sugaya |
| 2009/0261778 A1 | 10/2009 | Kook |
| 2009/0267558 A1 | 10/2009 | Jung |
| 2009/0267709 A1 | 10/2009 | Joannopoulos et al. |
| 2009/0267710 A1 | 10/2009 | Joannopoulos et al. |
| 2009/0271047 A1 | 10/2009 | Wakamatsu |
| 2009/0271048 A1 | 10/2009 | Wakamatsu |
| 2009/0273242 A1 | 11/2009 | Cook |
| 2009/0273318 A1 | 11/2009 | Rondoni et al. |
| 2009/0281678 A1 | 11/2009 | Wakamatsu |
| 2009/0284082 A1 | 11/2009 | Mohammadian |
| 2009/0284083 A1 | 11/2009 | Karalis et al. |
| 2009/0284218 A1 | 11/2009 | Mohammadian et al. |
| 2009/0284220 A1 | 11/2009 | Toncich et al. |
| 2009/0284227 A1 | 11/2009 | Mohammadian et al. |
| 2009/0284245 A1 | 11/2009 | Kirby et al. |
| 2009/0284369 A1 | 11/2009 | Toncich et al. |
| 2009/0286470 A1 | 11/2009 | Mohammadian et al. |
| 2009/0286475 A1 | 11/2009 | Toncich et al. |
| 2009/0286476 A1 | 11/2009 | Toncich et al. |
| 2009/0289595 A1 | 11/2009 | Chen et al. |
| 2009/0299918 A1 | 12/2009 | Cook et al. |
| 2009/0308933 A1 | 12/2009 | Osada |
| 2009/0322158 A1 | 12/2009 | Stevens et al. |
| 2009/0322280 A1 | 12/2009 | Kamijo et al. |
| 2010/0015918 A1 | 1/2010 | Liu et al. |
| 2010/0017249 A1 | 1/2010 | Fincham et al. |
| 2010/0020569 A1* | 1/2010 | Melanson ............ H01F 3/10 363/21.03 |
| 2010/0033021 A1 | 2/2010 | Bennett |
| 2010/0034238 A1 | 2/2010 | Bennett |
| 2010/0036773 A1 | 2/2010 | Bennett |
| 2010/0038970 A1 | 2/2010 | Cook et al. |
| 2010/0045114 A1 | 2/2010 | Sample et al. |
| 2010/0052431 A1 | 3/2010 | Mita |
| 2010/0052811 A1 | 3/2010 | Smith et al. |
| 2010/0060077 A1 | 3/2010 | Paulus et al. |
| 2010/0065352 A1 | 3/2010 | Ichikawa |
| 2010/0066349 A1 | 3/2010 | Lin et al. |
| 2010/0076524 A1 | 3/2010 | Forsberg et al. |
| 2010/0081379 A1 | 4/2010 | Cooper et al. |
| 2010/0094381 A1 | 4/2010 | Kim et al. |
| 2010/0096934 A1 | 4/2010 | Joannopoulos et al. |
| 2010/0102639 A1 | 4/2010 | Joannopoulos et al. |
| 2010/0102640 A1 | 4/2010 | Joannopoulos et al. |
| 2010/0102641 A1 | 4/2010 | Joannopoulos et al. |
| 2010/0104031 A1 | 4/2010 | Lacour |
| 2010/0109443 A1 | 5/2010 | Cook et al. |
| 2010/0109445 A1 | 5/2010 | Kurs et al. |
| 2010/0109604 A1 | 5/2010 | Boys et al. |
| 2010/0115474 A1 | 5/2010 | Takada et al. |
| 2010/0117454 A1 | 5/2010 | Cook et al. |
| 2010/0117455 A1 | 5/2010 | Joannopoulos et al. |
| 2010/0117456 A1 | 5/2010 | Karalis et al. |

(56) References Cited

U.S. PATENT DOCUMENTS

| | | |
|---|---|---|
| 2010/0117596 A1 | 5/2010 | Cook et al. |
| 2010/0123353 A1 | 5/2010 | Joannopoulos et al. |
| 2010/0123354 A1 | 5/2010 | Joannopoulos et al. |
| 2010/0123355 A1 | 5/2010 | Joannopoulos et al. |
| 2010/0123452 A1 | 5/2010 | Amano et al. |
| 2010/0123530 A1 | 5/2010 | Park et al. |
| 2010/0127573 A1 | 5/2010 | Joannopoulos et al. |
| 2010/0127574 A1 | 5/2010 | Joannopoulos et al. |
| 2010/0127575 A1 | 5/2010 | Joannopoulos et al. |
| 2010/0127660 A1 | 5/2010 | Cook et al. |
| 2010/0133918 A1 | 6/2010 | Joannopoulos et al. |
| 2010/0133919 A1 | 6/2010 | Joannopoulos et al. |
| 2010/0133920 A1 | 6/2010 | Joannopoulos et al. |
| 2010/0141042 A1 | 6/2010 | Kesler et al. |
| 2010/0148589 A1 | 6/2010 | Hamam et al. |
| 2010/0148723 A1 | 6/2010 | Cook et al. |
| 2010/0151808 A1 | 6/2010 | Toncich et al. |
| 2010/0156346 A1 | 6/2010 | Takada et al. |
| 2010/0156355 A1 | 6/2010 | Bauerle et al. |
| 2010/0156570 A1 | 6/2010 | Hong et al. |
| 2010/0164295 A1 | 7/2010 | Ichikawa et al. |
| 2010/0164296 A1 | 7/2010 | Kurs |
| 2010/0164297 A1 | 7/2010 | Kurs et al. |
| 2010/0164298 A1 | 7/2010 | Karalis et al. |
| 2010/0171368 A1 | 7/2010 | Schatz et al. |
| 2010/0171370 A1 | 7/2010 | Karalis et al. |
| 2010/0179384 A1 | 7/2010 | Hoeg et al. |
| 2010/0181843 A1 | 7/2010 | Schatz et al. |
| 2010/0181844 A1 | 7/2010 | Karalis et al. |
| 2010/0181845 A1 | 7/2010 | Fiorello et al. |
| 2010/0181961 A1 | 7/2010 | Novak et al. |
| 2010/0181964 A1 | 7/2010 | Huggins et al. |
| 2010/0184371 A1 | 7/2010 | Cook et al. |
| 2010/0187911 A1 | 7/2010 | Joannopoulos et al. |
| 2010/0187913 A1 | 7/2010 | Sample |
| 2010/0188183 A1 | 7/2010 | Shpiro |
| 2010/0190435 A1 | 7/2010 | Cook et al. |
| 2010/0190436 A1 | 7/2010 | Cook et al. |
| 2010/0194206 A1 | 8/2010 | Burdo et al. |
| 2010/0194207 A1 | 8/2010 | Graham |
| 2010/0194334 A1 | 8/2010 | Kirby et al. |
| 2010/0194335 A1 | 8/2010 | Kirby et al. |
| 2010/0201189 A1 | 8/2010 | Kirby et al. |
| 2010/0201201 A1 | 8/2010 | Mobarhan et al. |
| 2010/0201202 A1 | 8/2010 | Kirby et al. |
| 2010/0201203 A1 | 8/2010 | Schatz et al. |
| 2010/0201204 A1 | 8/2010 | Sakoda et al. |
| 2010/0201205 A1 | 8/2010 | Karalis et al. |
| 2010/0201310 A1 | 8/2010 | Vorenkamp et al. |
| 2010/0201312 A1 | 8/2010 | Kirby et al. |
| 2010/0201313 A1 | 8/2010 | Vorenkamp et al. |
| 2010/0201316 A1 | 8/2010 | Takada et al. |
| 2010/0201513 A1 | 8/2010 | Vorenkamp et al. |
| 2010/0207458 A1 | 8/2010 | Joannopoulos et al. |
| 2010/0210233 A1 | 8/2010 | Cook et al. |
| 2010/0213770 A1 | 8/2010 | Kikuchi |
| 2010/0213895 A1 | 8/2010 | Keating et al. |
| 2010/0217553 A1 | 8/2010 | Von Novak et al. |
| 2010/0219694 A1 | 9/2010 | Kurs et al. |
| 2010/0219695 A1 | 9/2010 | Komiyama et al. |
| 2010/0219696 A1 | 9/2010 | Kojima |
| 2010/0222010 A1 | 9/2010 | Ozaki et al. |
| 2010/0225175 A1 | 9/2010 | Karalis et al. |
| 2010/0225270 A1 | 9/2010 | Jacobs et al. |
| 2010/0225271 A1 | 9/2010 | Oyobe et al. |
| 2010/0225272 A1 | 9/2010 | Kirby et al. |
| 2010/0231053 A1 | 9/2010 | Karalis et al. |
| 2010/0231163 A1 | 9/2010 | Mashinsky |
| 2010/0231340 A1 | 9/2010 | Fiorello et al. |
| 2010/0234922 A1 | 9/2010 | Forsell |
| 2010/0235006 A1 | 9/2010 | Brown |
| 2010/0237706 A1 | 9/2010 | Karalis et al. |
| 2010/0237707 A1 | 9/2010 | Karalis et al. |
| 2010/0237708 A1 | 9/2010 | Karalis et al. |
| 2010/0237709 A1 | 9/2010 | Hall et al. |
| 2010/0244576 A1 | 9/2010 | Hillan et al. |
| 2010/0244577 A1 | 9/2010 | Shimokawa |
| 2010/0244578 A1 | 9/2010 | Yoshikawa |
| 2010/0244579 A1 | 9/2010 | Sogabe et al. |
| 2010/0244580 A1 | 9/2010 | Uchida et al. |
| 2010/0244581 A1 | 9/2010 | Uchida |
| 2010/0244582 A1 | 9/2010 | Yoshikawa |
| 2010/0244583 A1 | 9/2010 | Shimokawa |
| 2010/0244767 A1 | 9/2010 | Turner et al. |
| 2010/0244839 A1 | 9/2010 | Yoshikawa |
| 2010/0248622 A1 | 9/2010 | Kirby et al. |
| 2010/0253152 A1 | 10/2010 | Karalis et al. |
| 2010/0253281 A1 | 10/2010 | Li |
| 2010/0256481 A1 | 10/2010 | Mareci et al. |
| 2010/0256831 A1 | 10/2010 | Abramo et al. |
| 2010/0259108 A1 | 10/2010 | Giler et al. |
| 2010/0259109 A1 | 10/2010 | Sato |
| 2010/0259110 A1 | 10/2010 | Kurs et al. |
| 2010/0264745 A1 | 10/2010 | Karalis et al. |
| 2010/0264746 A1 | 10/2010 | Kazama et al. |
| 2010/0264747 A1 | 10/2010 | Hall et al. |
| 2010/0276995 A1 | 11/2010 | Marzetta et al. |
| 2010/0277003 A1 | 11/2010 | Von Novak et al. |
| 2010/0277004 A1 | 11/2010 | Suzuki et al. |
| 2010/0277005 A1 | 11/2010 | Karalis et al. |
| 2010/0277120 A1 | 11/2010 | Cook et al. |
| 2010/0277121 A1 | 11/2010 | Hall et al. |
| 2010/0289341 A1 | 11/2010 | Ozaki et al. |
| 2010/0289449 A1 | 11/2010 | Elo |
| 2010/0295505 A1 | 11/2010 | Jung et al. |
| 2010/0295506 A1 | 11/2010 | Ichikawa |
| 2010/0308939 A1 | 12/2010 | Kurs |
| 2010/0314946 A1 | 12/2010 | Budde et al. |
| 2010/0327660 A1 | 12/2010 | Karalis et al. |
| 2010/0327661 A1 | 12/2010 | Karalis et al. |
| 2010/0328044 A1 | 12/2010 | Waffenschmidt et al. |
| 2011/0004269 A1 | 1/2011 | Strother et al. |
| 2011/0012431 A1 | 1/2011 | Karalis et al. |
| 2011/0018361 A1 | 1/2011 | Karalis et al. |
| 2011/0025131 A1 | 2/2011 | Karalis et al. |
| 2011/0031928 A1 | 2/2011 | Soar |
| 2011/0043046 A1 | 2/2011 | Joannopoulos et al. |
| 2011/0043047 A1 | 2/2011 | Karalis et al. |
| 2011/0043048 A1 | 2/2011 | Karalis et al. |
| 2011/0043049 A1 | 2/2011 | Karalis et al. |
| 2011/0049995 A1 | 3/2011 | Hashiguchi |
| 2011/0049996 A1 | 3/2011 | Karalis et al. |
| 2011/0049998 A1 | 3/2011 | Karalis et al. |
| 2011/0074218 A1 | 3/2011 | Karalis et al. |
| 2011/0074346 A1 | 3/2011 | Hall et al. |
| 2011/0074347 A1 | 3/2011 | Karalis et al. |
| 2011/0089895 A1 | 4/2011 | Karalis et al. |
| 2011/0095618 A1 | 4/2011 | Schatz et al. |
| 2011/0115303 A1 | 5/2011 | Baarman et al. |
| 2011/0115431 A1 | 5/2011 | Dunworth et al. |
| 2011/0121920 A1 | 5/2011 | Kurs et al. |
| 2011/0128015 A1 | 6/2011 | Dorairaj et al. |
| 2011/0140544 A1 | 6/2011 | Karalis et al. |
| 2011/0148219 A1 | 6/2011 | Karalis et al. |
| 2011/0162895 A1 | 7/2011 | Karalis et al. |
| 2011/0169339 A1 | 7/2011 | Karalis et al. |
| 2011/0181122 A1 | 7/2011 | Karalis et al. |
| 2011/0193416 A1 | 8/2011 | Campanella et al. |
| 2011/0193419 A1 | 8/2011 | Karalis et al. |
| 2011/0198939 A1 | 8/2011 | Karalis et al. |
| 2011/0215086 A1 | 9/2011 | Yeh |
| 2011/0221278 A1 | 9/2011 | Karalis et al. |
| 2011/0227528 A1 | 9/2011 | Karalis et al. |
| 2011/0227530 A1 | 9/2011 | Karalis et al. |
| 2011/0241618 A1 | 10/2011 | Karalis et al. |
| 2011/0248573 A1 | 10/2011 | Kanno et al. |
| 2011/0254377 A1 | 10/2011 | Wildmer et al. |
| 2011/0254503 A1 | 10/2011 | Widmer et al. |
| 2011/0266878 A9 | 11/2011 | Cook et al. |
| 2011/0278943 A1 | 11/2011 | Eckhoff et al. |
| 2012/0001492 A9 | 1/2012 | Cook et al. |
| 2012/0001593 A1 | 1/2012 | DiGuardo |
| 2012/0007435 A1 | 1/2012 | Sada et al. |
| 2012/0007441 A1 | 1/2012 | John et al. |

(56) References Cited

U.S. PATENT DOCUMENTS

| | | |
|---|---|---|
| 2012/0025602 A1 | 2/2012 | Boys et al. |
| 2012/0032522 A1 | 2/2012 | Schatz et al. |
| 2012/0038525 A1 | 2/2012 | Monsalve Carcelen et al. |
| 2012/0062345 A1 | 3/2012 | Kurs et al. |
| 2012/0068549 A1 | 3/2012 | Karalis et al. |
| 2012/0086284 A1 | 4/2012 | Campanella et al. |
| 2012/0086867 A1 | 4/2012 | Kesler et al. |
| 2012/0091794 A1 | 4/2012 | Campanella et al. |
| 2012/0091795 A1 | 4/2012 | Fiorello et al. |
| 2012/0091796 A1 | 4/2012 | Kesler et al. |
| 2012/0091797 A1 | 4/2012 | Kesler et al. |
| 2012/0091819 A1 | 4/2012 | Kulikowski et al. |
| 2012/0091820 A1 | 4/2012 | Campanella et al. |
| 2012/0091949 A1 | 4/2012 | Campanella et al. |
| 2012/0091950 A1 | 4/2012 | Campanella et al. |
| 2012/0098350 A1 | 4/2012 | Campanella et al. |
| 2012/0112531 A1 | 5/2012 | Kesler et al. |
| 2012/0112532 A1 | 5/2012 | Kesler et al. |
| 2012/0112534 A1 | 5/2012 | Kesler et al. |
| 2012/0112535 A1 | 5/2012 | Karalis et al. |
| 2012/0112536 A1 | 5/2012 | Karalis et al. |
| 2012/0112538 A1 | 5/2012 | Kesler et al. |
| 2012/0112691 A1 | 5/2012 | Kurs et al. |
| 2012/0119569 A1 | 5/2012 | Karalis et al. |
| 2012/0119575 A1 | 5/2012 | Kurs et al. |
| 2012/0119576 A1 | 5/2012 | Kesler et al. |
| 2012/0119698 A1 | 5/2012 | Karalis et al. |
| 2012/0139355 A1 | 6/2012 | Ganem et al. |
| 2012/0139519 A1* | 6/2012 | Dearborn ............ H02M 3/1588 323/290 |
| 2012/0146575 A1 | 6/2012 | Armstrong et al. |
| 2012/0153732 A1 | 6/2012 | Kurs et al. |
| 2012/0153733 A1 | 6/2012 | Schatz et al. |
| 2012/0153734 A1 | 6/2012 | Kurs et al. |
| 2012/0153735 A1 | 6/2012 | Karalis et al. |
| 2012/0153736 A1 | 6/2012 | Karalis et al. |
| 2012/0153737 A1 | 6/2012 | Karalis et al. |
| 2012/0153738 A1 | 6/2012 | Karalis et al. |
| 2012/0153893 A1 | 6/2012 | Schatz et al. |
| 2012/0168081 A1* | 7/2012 | Son .................. H01G 5/16 156/345.28 |
| 2012/0184338 A1 | 7/2012 | Kesler et al. |
| 2012/0206096 A1 | 8/2012 | John |
| 2012/0223573 A1 | 9/2012 | Schatz et al. |
| 2012/0228952 A1 | 9/2012 | Hall et al. |
| 2012/0228953 A1 | 9/2012 | Kesler et al. |
| 2012/0228954 A1 | 9/2012 | Kesler et al. |
| 2012/0235500 A1 | 9/2012 | Ganem et al. |
| 2012/0235501 A1 | 9/2012 | Kesler et al. |
| 2012/0235502 A1 | 9/2012 | Kesler et al. |
| 2012/0235503 A1 | 9/2012 | Kesler et al. |
| 2012/0235504 A1 | 9/2012 | Kesler et al. |
| 2012/0235505 A1 | 9/2012 | Schatz et al. |
| 2012/0235566 A1 | 9/2012 | Karalis et al. |
| 2012/0235567 A1 | 9/2012 | Karalis et al. |
| 2012/0235633 A1 | 9/2012 | Kesler et al. |
| 2012/0235634 A1 | 9/2012 | Hall et al. |
| 2012/0239117 A1 | 9/2012 | Kesler et al. |
| 2012/0242159 A1 | 9/2012 | Lou et al. |
| 2012/0242225 A1 | 9/2012 | Karalis et al. |
| 2012/0248884 A1 | 10/2012 | Karalis et al. |
| 2012/0248886 A1 | 10/2012 | Kesler et al. |
| 2012/0248887 A1 | 10/2012 | Kesler et al. |
| 2012/0248888 A1 | 10/2012 | Kesler et al. |
| 2012/0248981 A1 | 10/2012 | Karalis et al. |
| 2012/0256494 A1 | 10/2012 | Kesler et al. |
| 2012/0267960 A1 | 10/2012 | Low et al. |
| 2012/0280765 A1 | 11/2012 | Kurs et al. |
| 2012/0313449 A1 | 12/2012 | Kurs et al. |
| 2012/0313742 A1 | 12/2012 | Kurs et al. |
| 2013/0007949 A1 | 1/2013 | Kurs et al. |
| 2013/0020878 A1 | 1/2013 | Karalis et al. |
| 2013/0033118 A1 | 2/2013 | Karalis et al. |
| 2013/0038402 A1 | 2/2013 | Karalis et al. |
| 2013/0057364 A1 | 3/2013 | Kesler et al. |
| 2013/0062966 A1 | 3/2013 | Verghese et al. |
| 2013/0069441 A1 | 3/2013 | Verghese et al. |
| 2013/0069753 A1 | 3/2013 | Kurs et al. |
| 2013/0099587 A1 | 4/2013 | Lou et al. |
| 2013/0154383 A1 | 6/2013 | Kasturi et al. |
| 2013/0154389 A1 | 6/2013 | Kurs et al. |
| 2013/0159956 A1 | 6/2013 | Verghese et al. |
| 2013/0175874 A1 | 7/2013 | Lou et al. |
| 2013/0175875 A1 | 7/2013 | Kurs et al. |
| 2013/0200716 A1 | 8/2013 | Kesler et al. |
| 2013/0200721 A1 | 8/2013 | Kurs et al. |
| 2013/0221744 A1 | 8/2013 | Hall et al. |
| 2013/0278073 A1 | 10/2013 | Kurs et al. |
| 2013/0278074 A1 | 10/2013 | Kurs et al. |
| 2013/0278075 A1 | 10/2013 | Kurs et al. |
| 2013/0300353 A1 | 11/2013 | Kurs et al. |
| 2013/0307349 A1 | 11/2013 | Hall et al. |
| 2013/0320773 A1 | 12/2013 | Schatz et al. |
| 2013/0334892 A1 | 12/2013 | Hall et al. |
| 2014/0002012 A1 | 1/2014 | McCauley et al. |
| 2014/0062551 A1 | 3/2014 | Bhaumik et al. |
| 2014/0070764 A1 | 3/2014 | Keeling |
| 2014/0227978 A1 | 8/2014 | Ikeda et al. |
| 2016/0254700 A1* | 9/2016 | Akuzawa ................ H02M 7/48 307/104 |
| 2016/0254702 A1* | 9/2016 | Akuzawa ................ H02J 50/12 307/104 |
| 2017/0040943 A1* | 2/2017 | Pavao-Moreira .... H03B 5/1265 |
| 2017/0187284 A1* | 6/2017 | Vaidya ................. H02M 1/083 |

FOREIGN PATENT DOCUMENTS

| | | | |
|---|---|---|---|
| CN | 102439669 | 5/2012 | |
| CN | 103329397 | 9/2013 | |
| CN | 103855928 | 6/2014 | |
| DE | 38 24 972 | 1/1989 | |
| DE | 100 29147 | 12/2001 | |
| DE | 200 16 655 | 3/2002 | |
| DE | 102 21 484 | 11/2003 | |
| DE | 103 04 584 | 8/2004 | |
| DE | 10 2005 036290 | 2/2007 | |
| DE | 10 2006 044057 | 4/2008 | |
| EP | 1 335 477 | 8/2003 | |
| EP | 1 521 206 | 4/2005 | |
| EP | 1 524 010 | 4/2005 | |
| EP | 2 026 630 | 2/2009 | |
| EP | 2 357 716 | 8/2011 | |
| EP | 3089324 A1 * | 11/2016 | ............ B60L 11/182 |
| JP | 02-097005 | 4/1990 | |
| JP | 4-265875 | 9/1992 | |
| JP | 6-341410 | 12/1994 | |
| JP | 9-182323 | 7/1997 | |
| JP | 9-298847 | 11/1997 | |
| JP | 10-164837 | 6/1998 | |
| JP | 11-75329 | 3/1999 | |
| JP | 11-188113 | 7/1999 | |
| JP | 2001-309580 | 11/2001 | |
| JP | 2002-010535 | 1/2002 | |
| JP | 2003-179526 | 6/2003 | |
| JP | 2004-166459 | 6/2004 | |
| JP | 2004-201458 | 7/2004 | |
| JP | 2004-229144 | 8/2004 | |
| JP | 2005-57444 | 3/2005 | |
| JP | 2005-149238 | 6/2005 | |
| JP | 2006-074848 | 3/2006 | |
| JP | 2007-505480 | 3/2007 | |
| JP | 2007-266892 | 10/2007 | |
| JP | 2007-537637 | 12/2007 | |
| JP | 2008-508842 | 3/2008 | |
| JP | 2008-206231 | 9/2008 | |
| JP | 2008-206327 | 9/2008 | |
| JP | 2011-072074 | 4/2011 | |
| JP | 2012-504387 | 2/2012 | |
| JP | 2013-543718 | 12/2013 | |
| KR | 10-2007-0017804 | 2/2007 | |
| KR | 10-2008-0007635 | 1/2008 | |
| KR | 10-2009-0122072 | 11/2009 | |
| KR | 10-2011-0050920 | 5/2011 | |
| SG | 112842 | 7/2005 | |

(56) References Cited

FOREIGN PATENT DOCUMENTS

| | | |
|---|---|---|
| WO | WO 92/17929 | 10/1992 |
| WO | WO 93/23908 | 11/1993 |
| WO | WO 94/28560 | 12/1994 |
| WO | WO 95/11545 | 4/1995 |
| WO | WO 96/02970 | 2/1996 |
| WO | WO 98/50993 | 11/1998 |
| WO | WO 00/77910 | 12/2000 |
| WO | WO 03/092329 | 11/2003 |
| WO | WO 03/096361 | 11/2003 |
| WO | WO 03/096512 | 11/2003 |
| WO | WO 2004/015885 | 2/2004 |
| WO | WO 2004/038888 | 5/2004 |
| WO | WO 2004/055654 | 7/2004 |
| WO | WO 2004/073150 | 8/2004 |
| WO | WO 2004/073166 | 8/2004 |
| WO | WO 2004/073176 | 8/2004 |
| WO | WO 2004/073177 | 8/2004 |
| WO | WO 2004/112216 | 12/2004 |
| WO | WO 2005/024865 | 3/2005 |
| WO | WO 2005/060068 | 6/2005 |
| WO | WO 2005/109597 | 11/2005 |
| WO | WO 2005/109598 | 11/2005 |
| WO | WO 2006/011769 | 2/2006 |
| WO | WO 2007/008646 | 1/2007 |
| WO | WO 2007/020583 | 2/2007 |
| WO | WO 2007/042952 | 4/2007 |
| WO | WO 2007/084716 | 7/2007 |
| WO | WO 2007/084717 | 7/2007 |
| WO | WO 2008/109489 | 9/2008 |
| WO | WO 2008/118178 | 10/2008 |
| WO | WO 2009/009559 | 1/2009 |
| WO | WO 2009/018568 | 2/2009 |
| WO | WO 2009/023155 | 2/2009 |
| WO | WO 2009/023646 | 2/2009 |
| WO | WO 2009/033043 | 3/2009 |
| WO | WO 2009/062438 | 5/2009 |
| WO | WO 2009/070730 | 6/2009 |
| WO | WO 2009/126963 | 10/2009 |
| WO | WO 2009/140506 | 11/2009 |
| WO | WO 2009/149464 | 12/2009 |
| WO | WO 2009/155000 | 12/2009 |
| WO | WO 2010/030977 | 3/2010 |
| WO | WO 2010/036980 | 4/2010 |
| WO | WO 2010/039967 | 4/2010 |
| WO | WO 2010/090538 | 8/2010 |
| WO | WO 2010/090539 | 8/2010 |
| WO | WO 2010/093997 | 8/2010 |
| WO | WO 2010/104569 | 9/2010 |
| WO | WO 2011/061388 | 5/2011 |
| WO | WO 2011/061821 | 5/2011 |
| WO | WO 2011/062827 | 5/2011 |
| WO | WO 2011/112795 | 9/2011 |
| WO | WO 2012/037279 | 3/2012 |
| WO | WO 2012/170278 | 12/2012 |
| WO | WO 2013/013235 | 1/2013 |
| WO | WO 2013/019819 | 2/2013 |
| WO | WO 2013/020138 | 2/2013 |
| WO | WO 2013/036947 | 3/2013 |
| WO | WO 2013/059441 | 4/2013 |
| WO | WO 2013/067484 | 5/2013 |
| WO | WO 2013/113017 | 8/2013 |
| WO | WO 2013/142840 | 9/2013 |
| WO | WO 2014/004843 | 1/2014 |
| WO | WO 2014/125392 | 8/2014 ................ H02J 5/00 |
| WO | WO 2015/063920 | 5/2015 .............. H02M 7/48 |

OTHER PUBLICATIONS

"Physics Update, Unwired Energy", *Physics Today*, pp. 26, (Jan. 2007) (See http://arxiv.org/abs/physics/0611063.).
"In pictures: A year in technology", *BBC News*, (Dec. 28, 2007).
"Next Little Thing 2010 Electricity without wires", CNN Money (See money.cnn.com/galleries/2009/smallbusiness/0911/gallery.next_little_thing_2010.smb/) (dated Nov. 30, 2009).

Abe et al. "A Noncontact Charger Using a Resonant Converter with Parallel Capacitor of the Secondary Coil". IEEE, 36(2):444-451, Mar./Apr. 2000.
Ahmadian, M. et al., "Miniature Transmitter for Implantable Micro Systems", *Proceedings of the 25th Annual International Conference of the IEEE EMBS Cancun, Mexico*, pp. 3028-3031.(Sep. 17-21, 2003).
Aoki, T. et al., "Observation of strong coupling between one atom and a monolithic microresonator", Nature, vol. 443:671-674 (2006).
Apneseth et al. "Introducing wireless proximity switches" ABB Review Apr. 2002.
Aristeidis Karalis et al., "Efficient Wireless non-radiative mid-range energy transfer", *Annals of Physics*, vol. 323, pp. 34-48 (2008).
Baker et al., "Feedback Analysis and Design of RF Power Links for Low-Power Bionic Systems," *IEEE Transactions on Biomedical Circuits and Systems*, vol. 1(1):28-38 (Mar. 2007).
Balanis, C.A., "Antenna Theory: Analysis and Design," 3rd Edition, Sections 4.2, 4.3, 5.2, 5.3 (Wiley, New Jersey, 2005).
Berardelli, P., "Outlets Are Out", ScienceNOW Daily News, Science Now, http://sciencenow.sciencemag.org/ cgi/content/full/2006/1114/2, (Nov. 14, 2006) 2 pages.
Biever, C., "Evanescent coupling' could power gadgets wirelessly", NewScientistsTech.com, http://www. newscientisttech.com/article.ns?id=dn1 0575&print=true, (Nov. 15, 2006) 2 pages.
Borenstein, S., "Man tries wirelessly boosting batteries", (The Associated Press), USA Today, (Nov. 16, 2006) 1 page.
Borenstein, S., "Man tries wirelessly boosting batteries", AP Science Writer, Boston.com, (See http://www.boston.com/business/technology/articles/2006/11/15/man_tries_wirelessly_b . . . ) (Nov. 15, 2006).
Boyle, A., "Electro-nirvana? Not so fast", MSNBC, http:/lcosmiclog.msnbc.msn.com/_news/2007/06/08/4350760- electro-nirvana-not-so-fast, (Jun. 8, 2007) 1 page.
Budhia, M. et al., "A New IPT Magnetic Coupler for Electric Vehicle Charging Systems", IECON 2010—36th Annual Conference on IEEE Industrial Electronics Society, Glendale, AZ, pp. 2487-2492 (Nov. 7-10, 2010).
Budhia, M. et al., "Development and evaluation of single sided flux couplers for contactless electric vehicle charging", 2011 IEEE Energy Conversion Congress and Exposition (ECCE), Phoenix, AZ, pp. 614-621 (Sep. 17-22, 2011).
Budhia, M. et al.,"Development of a Single-Sided Flux Magnetic Coupler for Electric Vehicle IPT", *IEEE Transactions on Industrial Electronics*, vol. 60:318-328 (Jan. 2013).
Bulkeley, W. M., "MIT Scientists Pave the Way for Wireless Battery Charging", The Wall Street Journal (See http://online.wsj.com/article/SB118123955549228045.html?mod=googlenews_wsj), (Jun. 8, 2007) 2 pages.
Burri et al., "Invention Description", (Feb. 5, 2008).
Cass, S., "Air Power—Wireless data connections are common—now scientists are working on wireless power", Sponsored by IEEE Spectrum, http://spectrum.ieee.org/computing/hardware/air-power, (Nov. 2006) 2 pages.
Castelvecchi, Davide, "The Power of Induction—Cutting the last cord could resonate with our increasingly gadget dependent lives", *Science News Online*, vol. 172, No. 3, Jul. 21, 2007, 6 pages.
Chang, A., "Recharging the Wireless Way—Even physicists forget to recharge their cell phones sometimes.", PC Magazine, ABC News Internet Ventures, (Dec. 12, 2006) 1 page.
ChinaView ,"Scientists light bulb with 'wireless electricity'",www.Chinaview.cn, http://news.xinhuanet.com/english/2007-06/08/content_6215681.htm,Jun. 2007,1 page.
Cooks, G., "The vision of an MIT physicist: Getting rid of pesky rechargers", Boston.com, (Dec. 11, 2006) 1 page.
Derbyshire, D., "The end of the plug? Scientists invent wireless device that beams electricity through your home", Daily Mail, http://www.dailymail.co.uk/pages/live/articles/technology/technology.html?in_article_id=4 . . . ), (Jun. 7, 2007) 3 pages.
Eisenberg, Anne, "Automatic Recharging, From a Distance", The New York Times, (see www.nytimes.com/2012/03/11/business/built-in-wireless-chargeing-for-electronic-devices.html?_r=0) (published on Mar. 10, 2012).

(56) References Cited

OTHER PUBLICATIONS

Esser et al., "A New Approach to Power Supplies for Robots", IEEE, vol. 27(5):872-875, (Sep./Oct. 1991).
Fan, Shanhui et al., "Rate-Equation Analysis of Output Efficiency and Modulation Rate of Photomic-Crystal Light-Emitting Diodes", IEEE Journal of Quantum Electronics, vol. 36(10):1123-1130 (Oct. 2000).
Fenske et al., "Dielectric Materials at Microwave Frequencies", Applied Microwave & Wireless, pp. 92-100 (2000).
Fernandez, C. et al., "A simple dc-dc converter for the power supply of a cochlear implant", IEEE, pp. 1965-1970 (2003).
Ferris, David, "How Wireless Charging Will Make Life Simpler (and Greener)", Forbes (See forbes.com/sites/davidferris/2012/07/24/how-wireless-charging-will-make-life-simpler-and-greener/print/) (dated Jul. 24, 2012).
Fildes, J., "Physics Promises Wireless Power", (Science and Technology Reporter), BBC News, (Nov. 15, 2006) 3 pages.
Fildes, J., "The technology with impact 2007", BBC News, (Dec. 27, 2007) 3 pages.
Fildes, J., "Wireless energy promise powers up", BBC News, http://news.bbc.co.uk/2/hi/technology/6725955.stm, (Jun. 7, 2007) 3 pages.
Finkenzeller, Klaus, "RFID Handbook—Fundamentals and Applications in Contactless Smart Cards", Nikkan Kohgyo-sya, Kanno Taihei, first version, pp. 32-37, 253 (Aug. 21, 2001).
Finkenzeller, Klaus, "RFID Handbook (2nd Edition)", The Nikkan Kogyo Shimbun, Ltd., pp. 19, 20, 38, 39, 43, 44, 62, 63, 67, 68, 87, 88, 291, 292 (Published on May 31, 2004).
Freedman, D.H., "Power on a Chip", MIT Technology Review, (Nov. 2004).
Gary Peterson, "MIT WiTricity Not so Original After All", *Feed Line No. 9*, (See http://www.tfcbooks.com/articles/witricity.htm) printed Nov. 12, 2009.
Geyi, Wen, "A Method for the Evaluation of Small Antenna Q", IEEE Transactions on Antennas and Propagation, vol. 51(8):2124-2129 (Aug. 2003).
Hadley, F., "Goodbye Wires—MIT Team Experimentally Demonstrates Wireless Power Transfer, Potentially Useful for Power Laptops, Cell-Phones Without Cords", Massachusetts Institute of Technology, Institute for Soldier D Nanotechnologies, http://web.mit.edu/newsoffice/2007/wireless-0607.html, (Jun. 7, 2007) 3 pages.
Haus, H.A., "Waves and Fields in Optoelectronics," Chapter 7 "Coupling of Modes—Reasonators and Couplers" (Prentice-Hall, New Jersey, 1984).
Heikkinen et al., "Performance and Efficiency of Planar Rectennas for Short-Range Wireless Power Transfer at 2.45 GHz", Microwave and Optical Technology Letters, vol. 31(2):86-91, (Oct. 20, 2001).
Highfield, R., "Wireless revolution could spell end of plugs",(Science Editor), Telegraph.co.uk, http://www.telegraph.co.uk/news/main.jhtml?xml=/news/2007/06/07/nwireless1 07.xml, (Jun. 7, 2007) 3 pages.
Hirai et al., "Integral Motor with Driver and Wireless Transmission of Power and Information for Autonomous Subspindle Drive", IEEE, vol. 15(1):13-20, (Jan. 2000).
Hirai et al., "Practical Study on Wireless Transmission of Power and Information for Autonomous Decentralized Manufacturing System", IEEE, vol. 46(2):349-359, Apr. 1999.
Hirai et al., "Study on Intelligent Battery Charging Using Inductive Transmission of Power and Information", IEEE, vol. 15(2):335-345, (Mar. 2000).
Hirai et al., "Wireless Transmission of Power and Information and Information for Cableless Linear Motor Drive", IEEE, vol. 15(1):21-27, (Jan. 2000).
Hirayama, M., "Splashpower—World Leaders in Wireless Power", PowerPoint presentation, Splashpower Japan, (Sep. 3, 2007) 30 pages.
Ho, S. L. et al., "A Comparative Study Between Novel Witricity and Traditional Inductive Magnetic Coupling in Wireless Charging", IEEE Transactions on Magnetics, vol. 47(5):1522-1525 (May 2011).
Infotech Online, "Recharging gadgets without cables", infotech.indiatimes com, (Nov. 17, 2006) 1 page.
Jackson, J. D., "Classical Electrodynamics", 3rd Edition, Wiley, New York, 1999, pp. 201-203.
Jackson, J.D., "Classical Electrodynamics," 3rd Edition, Sections 1.11, 5.5, 5.17, 6.9, 8.1, 8.8, 9.2, 9.3 (Wiley, New York, 1999).
Jacob, M. V. et al., "Lithium Tantalate—A High Permittivity Dielectric Material for Microwave Communication Systems", *Proceedings of IEEE TENCON—Poster Papers*, pp. 1362-1366, 2003.
Karalis, Aristeidis, "Electricity Unplugged", Feature: Wireless Energy Physics World, physicsworld.com, pp. 23-25 (Feb. 2009).
Kawamura et al., "Wireless Transmission of Power and Information Through One High-Frequency Resonant AC Link Inverter for Robot Manipulator Applications", IEEE, vol. 32(3):503-508, (May/Jun. 1996).
Kurs, A. et al., "Wireless Power Transfer via Strongly Coupled Magnetic Resonances", *Science* vol. 317, pp. 83-86 (Jul. 6, 2007).
Kurs, A. et al., "Simultaneous mid-range power transfer to multiple devices", *Applied Physics Letters*, vol. 96, No. 044102 (2010).
Kurs, A. et al.,"Optimized design of a low-resistance electrical conductor for the multimegahertz range", *Applied Physics Letters*, vol. 98:172504-172504-3 (Apr. 2011).
Lamb, Gregory M. ,"Look Ma—no wires!—Electricity broadcast through the air may someday run your home",The Christian Science Monitor,http://www.csmonitor.com/2006/1116/p14s01-stct.html,Nov. 15, 2006,2 pages.
Lee, "Antenna Circuit Design for RFID Applications," Microchip Technology Inc., AN710, 50 pages (2003).
Lee, "RFID Coil Design," Microchip Technology Inc., AN678, 21 pages (1998).
Liang et al., "Silicon waveguide two-photon absorption detector at 1.5 μm wavelength for autocorrelation measurements," Applied Physics Letters, 81(7):1323-1325 (Aug. 12, 2002).
Markoff, J. ,"Intel Moves to Free Gadgets of Their Recharging Cords", The New York Times—nytimes.com, Aug. 21, 2008, 2 pages.
Median, A. et al. "Design of class E amplifier with nonlinear and linear shunt capacitances for any duty cycle", IEEE Trans. Microwave Theor. Tech., vol. 55, No. 3, pp. 484-492, (2007).
Microchip Technology Inc., "microID 13.56 MHz Design Guide—MCRF355/360 Reader Reference Design," 24 pages (2001).
Minkel, J R. ,"Wireless Energy Lights Bulb from Seven Feet Away—Physicists vow to cut the cord between your laptop battery and the wall socket—with just a simple loop of wire",Scientific American,http://www.scientificamerican.com/article.cfm?id=wireless-energy-lights-bulb-from-seven-feet-away,Jun. 7, 2007,1 page.
Minkel, J R. ,"Wireless Energy Transfer May Power Devices at a Distance",Scientific American,Nov. 14, 2006,1 page.
Morgan, J., "Lab report: Pull the plug for a positive charge", The Herald, Web Issue 2680, (Nov. 16, 2006) 3 pages.
Moskvitch, Katia, "Wireless charging—the future for electric cars?", BBC News Technology (See www.bbc.co.uk/news/technology-14183409) (dated Jul. 21, 2011).
O'Brien et al., "Analysis of Wireless Power Supplies for Industrial Automation Systems", IEEE, pp. 367-372 (Nov. 2-6, 2003).
O'Brien et al., "Design of Large Air-Gap Transformers for Wireless Power Supplies", IEEE, pp. 1557-1562 (Jun. 15-19, 2003).
Pendry, J. B., "A Chiral Route to Negative Refraction", Science, vol. 306:1353-1355 (2004).
Physics Today, "Unwired energy questions asked answered", Sep. 2007, pp. 16-17.
Powercast LLC. "White Paper" Powercast simply wire free, 2003.
PR News Wire, "The Big Story for CES 2007: The public debut of eCoupled Intelligent Wireless Power", Press Release, Fulton Innovation LLC, Las Vegas, NV, (Dec. 27, 2006) 3 pages.
Press Release, "The world's first sheet-type wireless power transmission system: Will a socket be replaced by e-wall?",Public Relations Office, School of Engineering, University of Tokyo, Japan,Dec. 12, 2006,4 pages.
PressTV, "Wireless power transfer possible", http://edition.presstv.ir/detail/12754.html, Jun. 11, 2007, 1 page.

(56) References Cited

OTHER PUBLICATIONS

Reidy, C. (Globe Staff), "MIT discovery could unplug your iPod forever", Boston.com, http://www.boston.com/business/ticker/2007/06/mit_discovery_c.html, (Jun. 7, 2007) 3 pages.
Risen, C., "Wireless Energy", The New York Times, (Dec. 9, 2007) 1 page.
Sakamoto et al., "A Novel Circuit for Non-Contact Charging Through Electro-Magnetic Coupling", IEEE, pp. 168-174 (1992).
Scheible, G. et al., "Novel Wireless Power Supply System for Wireless Communication Devices in Industrial Automation Systems", IEEE, pp. 1358-1363, (Nov. 5-8, 2002).
Schneider, D. "A Critical Look at Wireless Power", *IEEE Spectrum*, pp. 35-39 (May 2010).
Schneider, David, "Electrons Unplugged. Wireless power at a distance is still far away", *IEEE Spectrum*, pp. 35-39 (May 2010).
Schuder, J. C. et al., "An Inductively Coupled RF System for the Transmission of 1 kW of Power Through the Skin", *IEEE Transactions on Bio-Medical Engineering*, vol. BME-18, No. 4, pp. 265-273 (Jul. 1971).
Schuder, J. C., "Powering an Artificial Heart: Birth of the Inductively Coupled-Radio Frequency System in 1960", *Artificial Organs*, vol. 26:909-915 (2002).
Schuder, J.C. et al., "Energy Transport Into the Closed Chest From a Set of Very-Large Mutually Orthogonal Coils", Communication Electronics, vol. 64:527-534 (Jan. 1963).
Schutz, J. et al., "Load Adaptive Medium Frequency Resonant Power Supply", IEEE, pp. 282-287 (Nov. 2002).
Sekitani et al. "A large-area wireless power-transmission sheet using printed organic transistors and plastic MEMS switches" www.nature.com/naturematerials. Published online Apr. 29, 2007.
Sekitani et al., "A large-area flexible wireless power transmission sheet using printed plastic MEMS switches and organic field-effect transistors", IEDM '06, International Electron Devices Meeting, (Dec. 11-13, 2006) 4 pages.
Sekiya, H. et al., "FM/PWM control scheme in class DE inverter", IEEE Trans. Circuits Syst. I, vol. 51(7) (Jul. 2004).
Senge, M., "MIT's wireless electricity for mobile phones", Vanguard, http://www.vanguardngr.com/articles/2002/features/gsm/gsm211062007.htm, (Jun. 11, 2007) 1 page.
Sensiper, S., "Electromagnetic wave propogation on helical conductors", Technical Report No. 194 (based on PhD Thesis), Massachusetts Institute of Technology, (May 16, 1951) 126 pages.
Soljacic, M., "Wireless Non-Radiative Energy Transfer—PowerPoint presentation". Massachusetts Institute of Technology, (Oct. 6, 2005).
Soljacic, M. et al., "Wireless Energy Transfer Can Potentially Recharge Laptops Cell Phones Without Cords", (Nov. 14, 2006) 3 pages.
Soljacic, M. et al., "Photonic-crystal slow-light enhancement of nonlinear phase sensitivity", *J. Opt. Soc. Am B*, vol. 19, No. 9, pp. 2052-2059 (Sep. 2002).
Soljacic, M., "Wireless nonradiative energy transfer", *Visions of Discovery New Light on Physics, Cosmology, and Consciousness*, Cambridge University Press, New York, NY pp. 530-542 (2011).
Someya, Takao. "The world's first sheet-type wireless power transmission system". University of Tokyo, (Dec. 12, 2006).
Staelin, David H. et al., Electromagnetic Waves, Chapters 2, 3, 4, and 8, pp. 46-176 and 336-405 (Prentice Hall Upper Saddle River, New Jersey 1998).
Stark III, Joseph C., "Wireless Power Transmission Utilizing a Phased Array of Tesla Coils", Master Thesis, Massachusetts Institute of Technology (2004).
Stewart, W., "The Power to Set you Free", Science, vol. 317:55-56 (Jul. 6, 2007).
Tang, S.C. et al., "Evaluation of the Shielding Effects on Printed-Circuit-Board Transformers Using Ferrite Plates and Copper Sheets", *IEEE Transactions on Power Electronics*, vol. 17:1080-1088 (Nov. 2002).
Tesla, Nikola, "High Frequency Oscillators for Electro-Therapeutic and Other Purposes", *Proceedings of the IEEE*, vol. 87:1282-1292 (Jul. 1999).
Tesla, Nikola, "High Frequency Oscillators for Electro-Therapeutic and Other Purposes", *The Electrical Engineer*, vol. XXVI, No. 50 (Nov. 17, 1898).
Texas Instruments, "HF Antenna Design Notes—Technical Application Report," Literature No. 11-08-26-003, 47 pages (Sep. 2003).
Thomsen et al., "Ultrahigh speed all-optical demultiplexing based on two-photon absorption in a laser diode," Electronics Letters, 34(19):1871-1872 (Sep. 17, 1998).
UPM Rafsec, "Tutorial overview of inductively coupled RFID Systems," 7 pages (May 2003).
Valtchev et al. "Efficient Resonant Inductive Coupling Energy Transfer Using New Magnetic and Design Criteria". IEEE, pp. 1293-1298, 2005.
Vandevoorde et al., "Wireless energy transfer for stand-alone systems: a comparison between low and high power applicability", Sensors and Actuators, vol. 92:305-311 (2001).
Vilkomerson, David et al., "Implantable Doppler System for Self-Monitoring Vascular Grafts", *IEEE Ultrasonics Symposium*, pp. 461-465 (2004).
Villeneuve, Pierre R. et al., "Microcavities in photonic crystals: Mode symmetry, tunability, and coupling efficiency", *Physical Review B*, vol. 54:7837-7842 (Sep. 15, 1996).
Yariv, Amnon et al., "Coupled-resonator optical waveguide: a proposal and analysis", *Optics Letters*, vol. 24(11):711-713 (Jun. 1, 1999).
Yates, David C. et al., "Optimal Transmission Frequency for Ultralow-Power Short-Range Radio Links", IEEE Transactions on Circuits and Systems-1, Regular Papers, vol. 51:1405-1413 (Jul. 2004).
Yoshihiro Konishi, *Microwave Electronic Circuit Technology*, Chapter 4, pp. 145-197 (Marcel Dekker, Inc., New York, NY 1998).
Ziaie, Babak et al., "A Low-Power Miniature Transmitter Using a Low-Loss Silicon Platform for Biotelemetry", *Proceedings—19th International Confereces IEEE/EMBS*, pp. 2221-2224, Oct. 30-Nov. 2, 1997) 4 pages.
Zierhofer, Clemens M. et al., "High-Efficiency Coupling—Insensitive Transcutaneous Power and Data Transmission via an Inductive Link", *IEEE Transactions on Biomedical Engineering*, vol. 37, No. 7, pp. 716-722 (Jul. 1990).
International Search Report and Written Opinion of the International Searching Authority for International Application No. PCT/US2016/056953 dated Feb. 6, 2017.
International Preliminary Report on Patentability and Written Opinion of the International Search Authority for International Application No. PCT/US2016/056953 dated May 3, 2018 (7 pages).
Communication from the European Patent Office for European Application No. 16794782.9 dated Sep. 13, 2018 (5 pages).

\* cited by examiner

DYNAMIC TUNING IN WIRELESS ENERGY TRANSFER SYSTEMS

CROSS-REFERENCE TO RELATED APPLICATION

This application claims priority to U.S. Provisional Patent Application No. 62/244,799, filed on Oct. 22, 2015, the entire contents of which are incorporated herein by reference.

BACKGROUND

Electronic devices may require the use of tunable circuit components. In some applications, an electronic device may need to adjust the values of one or more circuit components to match impedances between different portions of a circuit, such as in a dynamic impedance matching network. Existing tunable circuit components may have a limited dynamic range of values, imprecise tuning capabilities, or high power losses. In some cases, existing tunable circuit components may be unusable in high power circuits such as a wireless power transfer system having large voltage swings.

SUMMARY

In general, the disclosure features dynamically tunable circuit elements and related tuning circuits. In a first aspect, the disclosure features a variable capacitance device including a first capacitor, a first switch, a second capacitor, a second switch, and control circuitry. The first capacitor includes a first-capacitor first terminal and a first-capacitor second terminal, where the first-capacitor first terminal is electrically connected to a ground. The first switch includes a first-switch first terminal, a first-switch second terminal, and a first-switch control terminal. The first-switch first terminal is electrically connected to the first-capacitor first terminal, and the first-switch second terminal is electrically connected to the first-capacitor second terminal. The second capacitor includes a second-capacitor first terminal and a second-capacitor second terminal, where the second-capacitor first terminal is electrically connected to the ground. The second switch includes a second-switch first terminal, a second-switch second terminal, and a second-switch control terminal. The second-switch first terminal is electrically connected to the second-capacitor first terminal, and the second-switch second terminal is electrically connected to the second-capacitor second terminal. The control circuitry is coupled with the first-switch control terminal and the second-switch control terminal. The control circuitry is configured to adjust respective capacitances of the first and second capacitors by causing a first control signal to be applied to the first-switch control terminal for a duration of time in response to detecting a zero voltage condition across the first switch, and by causing a second control signal to be applied to the second-switch control terminal for the duration of time in response to detecting a zero voltage condition across the second switch. The first and second control signals cause the respective first and second switch to close.

This and other implementations can each optionally include one or more of the following features.

A capacitance of the variable capacitance device can depend upon the duration of time for which the first and second control signals are applied to the respective first-switch control terminal and second-switch control terminal. The first switch can be a first transistor and the second switch can be a second transistor. The control circuitry can be configured to receive an input signal and, in response to receiving the input signal, change the duration of time for which the first and second control signals are applied to the respective first-switch control terminal and second-switch control terminal.

In some implementations, the variable capacitance device can include a first comparator and a second comparator. The first comparator can include a first-comparator first input terminal electrically connected to the first-capacitor second terminal. The second comparator can include a second-comparator first input terminal electrically connected to the second-capacitor second terminal. The control circuitry can be coupled with a first-comparator output terminal of the first comparator and a second-comparator output terminal of the second comparator, where the control circuitry configured to detect the zero voltage condition across the first switch based on an output signal of the first comparator, and, in response, cause the first control signal to be applied to the first-switch control terminal for the duration of time; and to detect the zero voltage condition across the second switch based on an output signal of the second comparator, and, in response, cause the second control signal to be applied to the second-switch control terminal for the duration of time.

In some implementations, the variable capacitance device can include a third comparator and a fourth comparator. The third comparator can include a third-comparator first input terminal electrically connected to a first reference voltage and a third-comparator second input terminal electrically connected to the first-switch control terminal. The fourth comparator can include a fourth-comparator first input terminal electrically connected to a second reference voltage and a fourth-comparator second input terminal electrically connected to the second-switch control terminal. The control circuitry can be coupled with a third-comparator output terminal of the third comparator and a fourth-comparator output terminal of the fourth comparator. The control circuitry can be configured to: detect a first ON condition at the first-switch control terminal based on an output signal of the third comparator. Determine a first time difference, where the first time difference being a difference in time from detecting the zero voltage condition across the first switch and detecting the first ON condition at the first-switch control terminal. Adjust a first timing of when the first control signal is applied to the first-switch control terminal so as to reduce the first time difference. Detect a second ON condition at the second-switch control terminal based on an output signal of the fourth comparator. Determine a second time difference, where the second time difference being a difference in time from detecting the zero voltage condition across the second switch and detecting the second ON condition at the second-switch control terminal. And, adjust a second timing of when the second control signal is applied to the second-switch control terminal so as to reduce the second time difference.

In some implementations, the control circuitry can include a pulse width modulation (PWM) generator. The PWM generator can include a first output terminal electrically connected to the first-switch control terminal and a second output terminal electrically connected to the second-switch control terminal, where the first control signal is a first pulse width modulated signal and the second control signal is a second pulse width modulated signal, and the control circuitry is configured to control characteristics of the first and second pulse width modulated signals.

Adjusting the timing of when the first and second control signals are applied to the respective first-switch control terminal and the second-switch control terminal can include adjusting phases of the first and second pulse width modulated signals. The control circuitry can be configured to receive an input signal and, in response to receiving the input signal, change the duration of time for which the first and second control signals are applied to the respective control terminals of the first switch and the second switch by adjusting respective duty cycles of the first and second pulse width modulated signals.

In some implementations, the variable capacitance device can include a third comparator and a fourth comparator. The third comparator can include a third-comparator first input terminal electrically connected to a first reference voltage and a third-comparator second input terminal electrically connected to the first-switch control terminal. The fourth comparator can include a fourth-comparator first input terminal electrically connected to a second reference voltage and a fourth-comparator second input terminal electrically connected to the second-switch control terminal. And, the control circuitry can include a controller, a first counter, and a second counter. The first counter can be coupled with the first-comparator output terminal, the third-comparator output terminal, and the controller. In addition, the first counter can be configured to start a first timer in response to receiving a zero voltage signal from the first comparator, stop the first timer in response to receiving a first ON condition signal from the third comparator, and send a signal indicating an elapsed time of the first timer to the controller. The second counter can be coupled with the second-comparator output terminal, the fourth-comparator output terminal, and the controller. In addition, the second counter can be configured to start a second timer in response to receiving a zero voltage signal from the second comparator, stop the second timer in response to receiving a second ON condition signal from the fourth comparator, and send a signal indicating an elapsed time of the second timer to the controller. And, the controller can be configured to adjust a first timing of when the first control signal is applied to the first-switch control terminal, based on the first-time-difference signal, so as to reduce the first time difference, and adjust a second timing of when the second control signal is applied to the second-switch control terminal, based on the second-time-difference signal, so as to reduce the second time difference.

In some implementations, the control circuitry can include a PWM generator coupled with the controller. The PWM generator can include a first output terminal electrically connected to the first-switch control terminal and a second output terminal electrically connected to the second-switch control terminal, where the first control signal is a first pulse width modulated signal and the second control signal is a second pulse width modulated signal. The controller can be configured to control characteristics of the first and second pulse width modulated signals.

The controller can be one of: a microcontroller, a computer processor, a field programmable logic array (FPGA), or an application specific integrated circuit (ASIC).

In some implementations, detecting the zero voltage condition across the first switch based on an output signal of the first comparator, and, in response, causing the first control signal to be applied to the first-switch control terminal can include: determining a first phase difference between a first-comparator output signal and a third-comparator output signal, generating a third reference voltage based the first phase difference, and causing the first control signal to be applied to the first-switch control terminal upon detecting that a voltage signal at the first-switch second terminal has crossed a voltage value equal to the third reference voltage. Detecting the zero voltage condition across the second switch based on an output signal of the second comparator, and, in response, cause the second control signal to be applied to the second-switch control terminal can include: determining a second phase difference between a second-comparator output signal and a fourth-comparator output signal, generating a fourth reference voltage based the second phase difference, and causing the second control signal to be applied to the second-switch control terminal upon detecting that a voltage signal at the second-switch second terminal has crossed a voltage value equal to the fourth reference voltage.

In some implementations, the control circuitry includes a first phase detection circuit, a first integrator circuit, a fifth comparator, a first flip-flop, a second phase detection circuit, a second integrator circuit, a sixth comparator, a second flip-flop, and a controller. The first phase detection circuit is coupled with the first-comparator output terminal and a third-comparator output terminal of the third comparator. The first integrator circuit is coupled with the first phase detection circuit. The fifth comparator includes a fifth-comparator output terminal, a fifth-comparator first input terminal electrically connected to the first-capacitor second terminal, and a fifth-comparator second input terminal coupled with the first integrator circuit. The first flip-flop includes a first-flip-flop reset terminal, a first-flip-flop clock terminal electrically connected to the fifth-comparator output terminal, and a first-flip-flop output terminal electrically connected to the first-switch control terminal. The second phase detection circuit is coupled with the second-comparator output terminal and a fourth-comparator output terminal of the fourth comparator. The second integrator circuit is coupled with the second phase detection circuit. The sixth comparator includes a sixth-comparator output terminal, a sixth-comparator first input terminal electrically connected to the second-capacitor second terminal, and a sixth-comparator second input terminal coupled with the second integrator circuit. The second flip-flop includes a second-flip-flop reset terminal, a second-flip-flop clock terminal electrically connected to the sixth-comparator output terminal, and a second-flip-flop output terminal electrically connected to the second-switch control terminal. The controller is coupled with the first flip-flop and the second flip-flop and is configured to provide a first reset signal to the first flip-flop after the duration of time and to provide a second reset signal to the second flip-flop after the duration of time. The controller can be a PWM generator, where the first reset signal is a first pulse width modulated signal, and the second reset signal is a second pulse width modulated signal.

In a second aspect, the disclosure features a wireless energy transfer system includes a split coil resonator and a variable capacitance device. The split coil resonator includes a first winding magnetically coupled with a second winding. The variable capacitance device includes a first capacitor, a first switch, a second capacitor, a second switch, and control circuitry. The first capacitor includes a first-capacitor first terminal and a first-capacitor second terminal, the first-capacitor first terminal electrically connected to a ground, and the first-capacitor second terminal electrically connected to a first-winding terminal of the first winding of the split coil resonator. The first switch includes a first-switch first terminal, a first-switch second terminal, and a first-switch control terminal, the first-switch first terminal electrically connected to the first-capacitor first terminal, and the first-switch second terminal electrically connected to the first-capacitor second terminal. The second capacitor includes a second-capacitor first terminal and a second-capacitor second terminal, the second-capacitor first terminal electrically connected to the ground, and the second-capacitor second terminal electrically connected to a second-winding terminal of the second winding of the split coil resonator. The second switch comprising a second-switch first terminal, a second-switch second terminal, and a second-switch a control terminal, the second-switch first terminal electrically connected to the second-capacitor first terminal, and the second-switch second terminal electrically connected to the second-capacitor second terminal. The control circuitry is coupled with the first-switch control terminal and with the second-switch control terminal. The control circuitry is configured to adjust respective capacitances of the first and second capacitors by causing a first control signal to be applied to the first-switch control terminal for a duration of time in response to detecting a zero voltage condition across the first switch, and by causing a second control signal to be applied to the second-switch control terminal for the duration of time in response to detecting a zero voltage condition across the second switch. The first and second control signals cause the respective first and second switch to close.

This and other implementations can each optionally include one or more of the following features. In addition, the variable capacitance device can include any of the features described above.

In some implementations, the wireless energy transfer system can include a third capacitor and a fourth capacitor. The third capacitor can include a third-capacitor first terminal and a third-capacitor second terminal, the third-capacitor first terminal electrically connected to the first-winding terminal, and the third-capacitor second terminal electrically connected to the first-capacitor second terminal. And, the fourth capacitor can include a fourth-capacitor first terminal and a fourth-capacitor second terminal, the fourth-capacitor first terminal electrically connected to the second-winding terminal, and the fourth-capacitor second terminal electrically connected to the second-capacitor second terminal. The wireless energy transfer system can include a fixed impedance matching network coupled with a first-winding second terminal of the first winding and a second-winding second terminal of the second winding.

In some implementations, the wireless energy transfer system can include a third capacitor comprising a third-capacitor first terminal and a third-capacitor second terminal, the third-capacitor first terminal electrically connected to the first-winding terminal, and the third-capacitor second terminal electrically connected to the second-winding terminal.

In a third aspect, the disclosure features a zero voltage switching device including a switch, a first comparator, a second comparator and a controller. The switch includes a first terminal, a second terminal, and a control terminal. The first comparator includes a first input terminal electrically connected to the second terminal of the switch and a second input terminal electrically connected to the first terminal of the switch. The second comparator includes a first input terminal electrically connected to a reference voltage and a second input terminal electrically connected to the control terminal of the switch. The controller is coupled to respective output terminals of the first and second comparators. And, the controller is configured to: detect a zero voltage condition across the switch based on an output of the first comparator, and, in response, cause a control signal to be applied to the control terminal of the switch, wherein the control signal causes the switch to close. Detect an ON condition at the control terminal of the first switch based on an output of the second comparator. Determine a time difference, the time difference being a difference in time from detecting the zero voltage condition across the switch and detecting the ON condition at the control terminal of the switch. And, adjusting a timing of when the control signal is applied to the control terminal of the switch so as to reduce the time difference.

This and other implementations can each optionally include one or more of the following features.

The reference voltage can be selected based on characteristics of the switch. The switch can be a field effect transistor, where the control terminal is a gate of the transistor, the first terminal is one of a source or a drain of the transistor, and the second terminal is the other of the source or the drain of the transistor. The reference voltage can be selected based on the threshold voltage of the transistor. The controller can be one of: a microcontroller, a computer processor, a field programmable logic array (FPGA), or an application specific integrated circuit (ASIC).

In some implementations, the zero voltage switching device includes a PWM generator coupled with the controller, where the PWM generator includes an output terminal electrically connected to the control terminal of the switch. The control signal can be a pulse width modulated signal, and the controller can be configured to control characteristics of the pulse width modulated signal. Adjusting the timing of when the control signal is applied to the control terminal of the switch can include adjusting a phase of the pulse width modulated signal.

In a fourth aspect, the disclosure features a zero voltage switching device including a switch, a first comparator, a second comparator, and control circuitry. The switch includes a first terminal, a second terminal, and a control terminal. The first comparator includes a first-comparator output terminal and a first-comparator first input terminal electrically connected to the first terminal of the switch. The second comparator includes a second-comparator output terminal, a second-comparator first input terminal electrically connected to a first reference voltage, and a second-comparator second input terminal electrically connected to the control terminal of the switch. The control circuitry is coupled with the first-comparator output terminal and the second-comparator output terminal. In addition, the control circuitry is configured to: determine a phase difference between a first-comparator output signal and a second-comparator output signal, generate a second reference voltage based the phase difference, and cause a control signal to be applied to the switch control terminal upon detecting that a voltage signal at one of the first terminal or second terminal of the switch has crossed a voltage value equal to the second reference voltage.

In some implementations, the control circuitry includes, a phase detection circuit, an integrator circuit, a third comparator, a flip-flop, and a controller. The phase detection circuit can be coupled with the first-comparator output terminal and the second-comparator output terminal. The integrator circuit can be coupled with the phase detection circuit. The third comparator can include a third-comparator output terminal, a third-comparator first input terminal electrically connected to the first terminal of the switch, and a third-comparator second input terminal coupled with the integrator circuit. The flip-flop can include a reset terminal, a clock terminal electrically connected to the third-comparator output terminal, and an output terminal electrically connected to the control terminal of the switch. And, the controller can be coupled with the reset terminal of the flip-flop, and configured to provide a reset signal to the flip-flop.

The controller can be configured to provide the reset signal to turn the switch OFF after a switch ON duration. The switch can be a field effect transistor, where the control terminal is a gate of the transistor, the first terminal is one of a source or a drain of the transistor, and the second terminal is the other of the source or the drain of the transistor.

The first reference voltage can be selected based on the threshold voltage of the transistor. The phase detection circuit can be to determine a phase difference between an output signal from the first comparator and an output signal from the second comparator. The controller can be a PWM generator and the reset signal is a PWM signal.

Particular implementations of the subject matter described in this specification can be implemented so as to realize one or more of the following advantages. Implementations may permit the use of lower operating voltages for tuning circuit components. Some implementations may reduce voltage and current stresses on tunable circuit components. Some implementations may permit dynamic balancing of resonator coils. Some implementations may improve the accuracy of zero voltage switching (ZVS) controls.

Embodiments of the devices, circuits, and systems disclosed can also include any of the other features disclosed herein, including features disclosed in combination with different embodiments, and in any combination as appropriate.

The details of one or more implementations of the subject matter described in this specification are set forth in the accompanying drawings and the description below. Other features, aspects, and advantages of the subject matter will be apparent from the description, the drawings, and the claims.

BRIEF DESCRIPTION OF THE DRAWINGS

Like reference numbers and designations in the various drawings indicate like elements.

DETAILED DESCRIPTION

Figure 1:
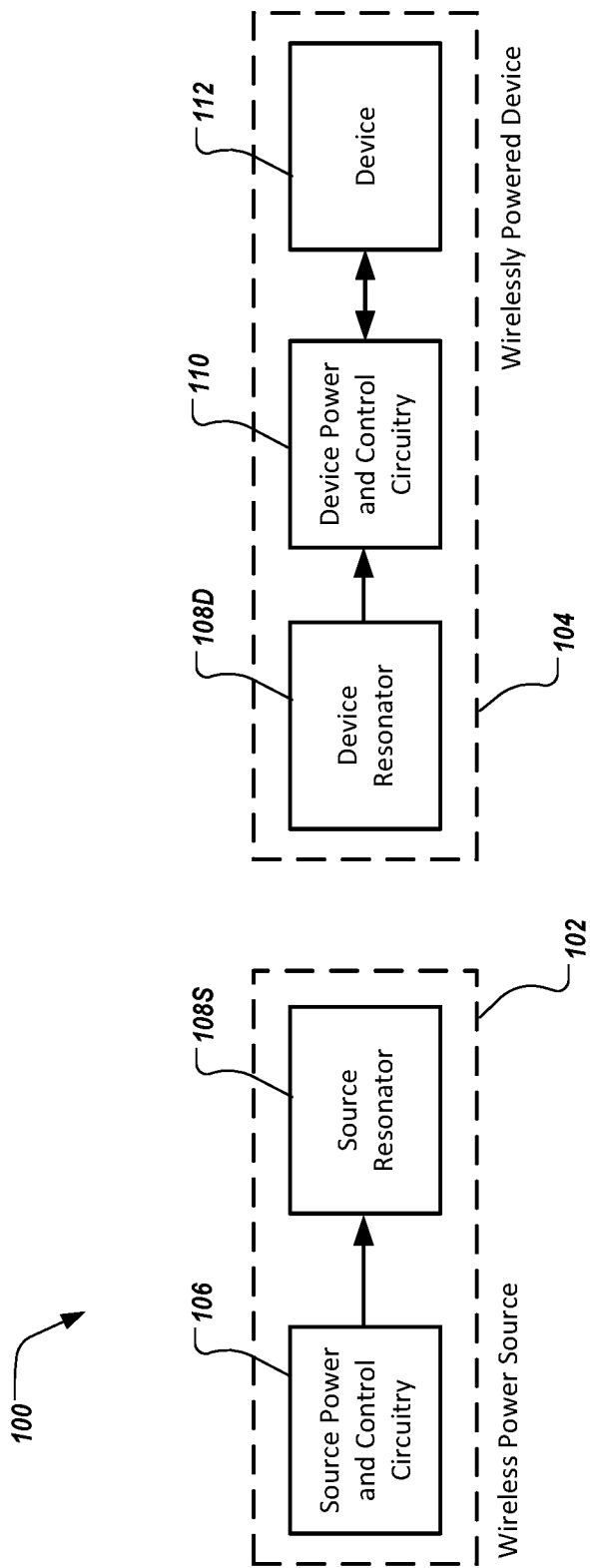
FIG. 1 shows a block diagram of an example of a wireless power transfer system.

Wireless energy transfer systems described herein can be implemented using a wide variety of resonators and resonant objects. As those skilled in the art will recognize, important considerations for resonator-based power transfer include resonator quality factor and resonator coupling. Extensive discussion of such issues, e.g., coupled mode theory (CMT), coupling coefficients and factors, quality factors (also referred to as Q-factors), and impedance matching is provided, for example, in U.S. patent application Ser. No. 13/428,142, published on Jul. 19, 2012 as US 2012/0184338, in U.S. patent application Ser. No. 13/567,893, published on Feb. 7, 2013 as US 2013/0033118, and in U.S. patent application Ser. No. 14/059,094, published on Apr. 24, 2014 as US 2014/0111019. The entire contents of each of these applications are incorporated by reference herein.

Power transfer systems may rely on electronic circuits such as rectifiers, AC (Alternating Current) to DC (Direct Current) converters, impedance matching circuits, and other power electronics to condition, monitor, maintain, and/or modify the characteristics of the voltage and/or current used to provide power to electronic devices. Power electronics can provide power to a load with dynamic input impedance characteristics. In some cases, in order to enable efficient power transfer, a dynamic impedance matching network is provided to match varying load impedances to that of the power source.

In some applications such as wireless power transfer, load impedances for a wireless power supply device may vary dynamically. In such applications, impedance matching between a load, such as a resonator coil, and a power supply of the device may be required to prevent unnecessary energy losses and excess heat. For example, the impedance associated with a resonator coil may be dynamic, in which case, a dynamic impedance matching network can be provided to match the varying power supply impedance (e.g., a device resonator) to that of the device. In the case of a wirelessly powered device, power supply impedances (e.g., a device resonator coil) may be highly variable. Therefore, an impedance matching network can be supplied between the device resonator coil and the power source of the device (e.g., battery or battery charging circuitry) to promote efficient transfer of power. Accordingly, power transfer systems transferring and/or receiving power via highly resonant wireless energy transfer, for example, may be required to configure or modify impedance matching networks to maintain efficient power transfer. The power electronics used in existing devices may not be capable of accurately detecting or measuring impedance mismatches or of rapidly accounting for impedance variations.

While the impedance matching circuits, methods, and systems disclosed herein are discussed in the context of a wireless power transfer system, it should be appreciated that they may be useful with other electronic devices as well. In some cases, the disclosed control circuitry and ZVS techniques may be used in other applications such as, for example, high power amplifiers and power supplies.

FIG. 1 shows a block diagram of an example of a wireless power transfer system 100. The system 100 includes a wireless power source 102 and a wirelessly powered or wirelessly charged device 104. Wirelessly powered or wirelessly charged devices 104 can include, for example, electronic devices such as laptops, smartphones, tablets, and other mobile electronic devices that are commonly placed on desktops, tabletops, bar tops, and other types of surfaces. The device 104 includes a device resonator 108D, device power and control circuitry 110, and a wirelessly powered or wirelessly charged electronic device 112, to which either DC or AC or both AC and DC power is transferred. The wireless power source 102 includes source power and control circuitry 106 and a source resonator 108S. The electronic device 112 or devices that receive power from the device resonator 108D and device power and control circuitry 110 can be, for example, an electronic device such as a laptop, smartphone, and other mobile electronic devices. The device resonator 108D and device circuitry 110 delivers power to the device/devices 112 that can be used to recharge the battery of the device/devices, power the device/devices directly, or both when in the vicinity of the source resonator 108S.

The power source 102 can be powered from a number of DC or AC voltage, current or power sources including, for example, a USB (Universal Serial Bus) port of a computer. In addition, the source 102 can be powered from the electric grid, from a wall plug, from a battery, from a power supply, from an engine, from a solar cell, from a generator, or from another source resonator. The source power and control circuitry 106 can include circuits and components to isolate the source electronics from the power supply, so that any reflected power or signals are not coupled out through the source input terminals.

The source power and control circuitry 106 can drive the source resonator 108S with alternating current, such as with a frequency greater than 10 kHz and less than 100 MHz (e.g., 6.78 MHz). The source power and control circuitry 106 can include, for example, impedance matching circuitry, a DC-to-DC converter, an AC-to-DC converter, or both an AC-to-DC converter and a DC-to-DC converter, an oscillator, and a power amplifier.

The device power and control circuitry 110 can be designed to transform alternating current power from the device resonator 108D to stable direct current power suitable for powering or charging one or more devices 112. The device power and control circuitry 110 can be designed to transform an alternating current power at one frequency (e.g., 6.78 MHz) from the device resonator to alternating current power at a different frequency suitable for powering or charging one or more devices 112. The power and control circuitry can include, for example, impedance matching circuitry, rectification circuitry, voltage limiting circuitry, current limiting circuitry, AC-to-DC converter circuitry, DC-to-DC converter circuitry, DC-to-AC converter circuitry, AC-to-AC converter circuitry, and battery charge control circuitry.

The power source 102 and the device 104 can have tuning capabilities, for example, dynamic impedance matching circuits, that allow adjustment of operating points to compensate for changing environmental conditions, perturbations, and loading conditions that can affect the operation of the source and device resonators and the efficiency of the energy transfer. The tuning capability can also be used to multiplex power delivery to multiple devices, from multiple sources, to multiple systems, to multiple repeaters or relays, and the like. The tuning capability can be controlled automatically, and may be performed continuously, periodically, intermittently or at scheduled times or intervals. In some implementations, manual input can be used to configure a control algorithm for tuning the impedance matching circuits.

The power source 102 and the device 104 resonators may be separated by many meters or they may be very close to each other or they may be separated by any distance in between. The source and device resonators 108S, 108D may be offset from each other laterally or axially. The source and device resonators 108S, 108D may be directly aligned (no lateral offset). The source and device resonators 108S, 108D may be oriented so that the surface areas enclosed by their inductive elements are approximately parallel to each other. The source and device resonators 108S, 108D may be oriented so that the surface areas enclosed by their inductive elements are approximately perpendicular to each other, or they may be oriented for any relative angle (0 to 360 degrees) between them. Such variations in the physical arrangement between the source and device resonators 108S, 108D may affect power coupling between the resonators 108S, 108D, and thereby, alter impedances exhibited by the resonators 108S, 108D to the source power and control circuitry 106 or device power and control circuitry 110, respectively.

Figure 2:
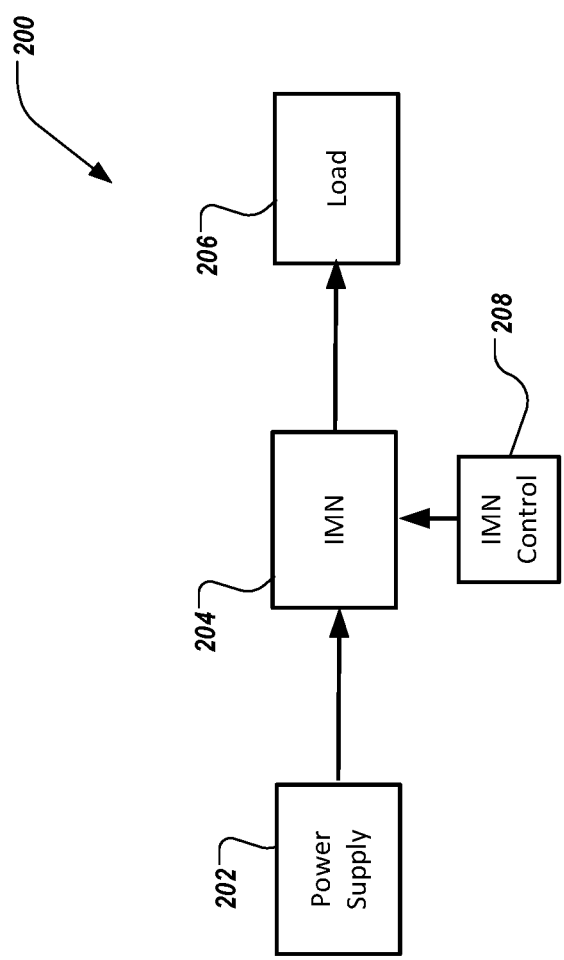
FIG. 2 shows a block diagram of an example wireless power transfer system including an impedance matching network.

FIG. 2 shows a block diagram of an example wireless power transfer system 200 including an impedance matching network (IMN) 204 and IMN control circuitry 208. The system 200 can, for example, be implemented as part of either the wireless power source 102 or the wirelessly powered or charged device 104 of FIG. 1. The system 200 includes a power supply 202, an IMN 204, a load 206, and IMN control circuitry 208. The load 206 can be, for example, the source resonator 108S of the wireless power source 102. In another example, the power supply 202 can be the source power and control circuitry 106 of the wireless power source 102. The power supply 202 can be the device resonator 108D of the device 104. The load 206 can be the electronic device 112 powered by or a battery of the electronic device 112 charged by the device resonator 108D. The impedance exhibited by either the load 206 or the power supply 202 may be dynamic and vary based on, for example, a physical position of a device 104 (e.g., a device resonator 108D) in relation to a wireless power source 102 (e.g., a source resonator 108S).

The impedance-matching network 204 can be designed to maximize the power delivered between power supply 202 and the load 206 at a desired frequency (e.g., 6.78 MHz). The impedance matching components in the IMN 204 can be chosen and connected so as to preserve a high-Q value of the resonator. Depending on the operating conditions, the components in the IMN 204 can be automatically tuned to control the power delivered from the power supply 202 to the load 206, for example, to maximize efficient transfer of power from a power supply 202 to a source resonator (e.g., load 206 of a wireless power source 102).

The IMN 204 components can include, for example, a capacitor or networks of capacitors, an inductor or networks of inductors, or various combinations of capacitors, inductors, diodes, switches, and resistors. The components of the impedance matching network can be adjustable and variable and can be controlled to affect the efficiency and operating point of the system. The impedance matching can be performed by controlling the connection point of the resonator, adjusting the permeability of a magnetic material, controlling a bias field, adjusting the frequency of excitation, and the like. The impedance matching can use or include any number or combination of varactors, varactor arrays, switched elements, capacitor banks, switched and tunable elements, reverse bias diodes, air gap capacitors, compression capacitors, barium zirconium titanate (BZT) electrically tuned capacitors, microelectromechanical systems (MEMS)-tunable capacitors, voltage variable dielectrics, transformer coupled tuning circuits, and the like. The variable components can be mechanically tuned, thermally tuned, electrically tuned, piezo-electrically tuned, and the like. Elements of the impedance matching can be silicon devices, gallium nitride devices, silicon carbide devices, and the like. The elements can be chosen to withstand high currents, high voltages, high powers, or any combination of current, voltage and power. The elements can be chosen to be high-Q elements.

The IMN control circuitry 208 monitors impedance differences between the source 202 and the load 206 and provides control signals to the IMN 204 to tune the IMN 204 or components thereof. In some instances, the IMN control circuitry 208 can include ZVS circuitry to reduce power losses and increase the overall efficiency of the circuit. For example, ZVS circuitry can control switching operations within the IMN 204 to occur when a voltage (e.g., a voltage across one or more components) is near or at zero. In so doing, the IMN control circuitry 208 may minimize transients and power losses.

In some implementations, the IMN 204 can include a fixed IMN and a dynamic IMN. For example, a fixed IMN may provide impedance matching between portions of the system with static impedances or to grossly tune a circuit to a known dynamic impedance range. In some implementations, a dynamic IMN can be further composed of a coarsely adjustable IMN and a finely adjustable IMN. For example, the coarsely adjustable IMN can permit coarse impedance adjustments within a dynamic impedance range and the finely adjustable IMN can be used to fine tune the overall impedance of the IMN 204. In another example, the coarsely adjustable IMN can attain impedance matching within a desirable impedance range and the finely adjustable IMN can achieve a more precise impedance around a target within the desirable impedance range.

Figure 3:
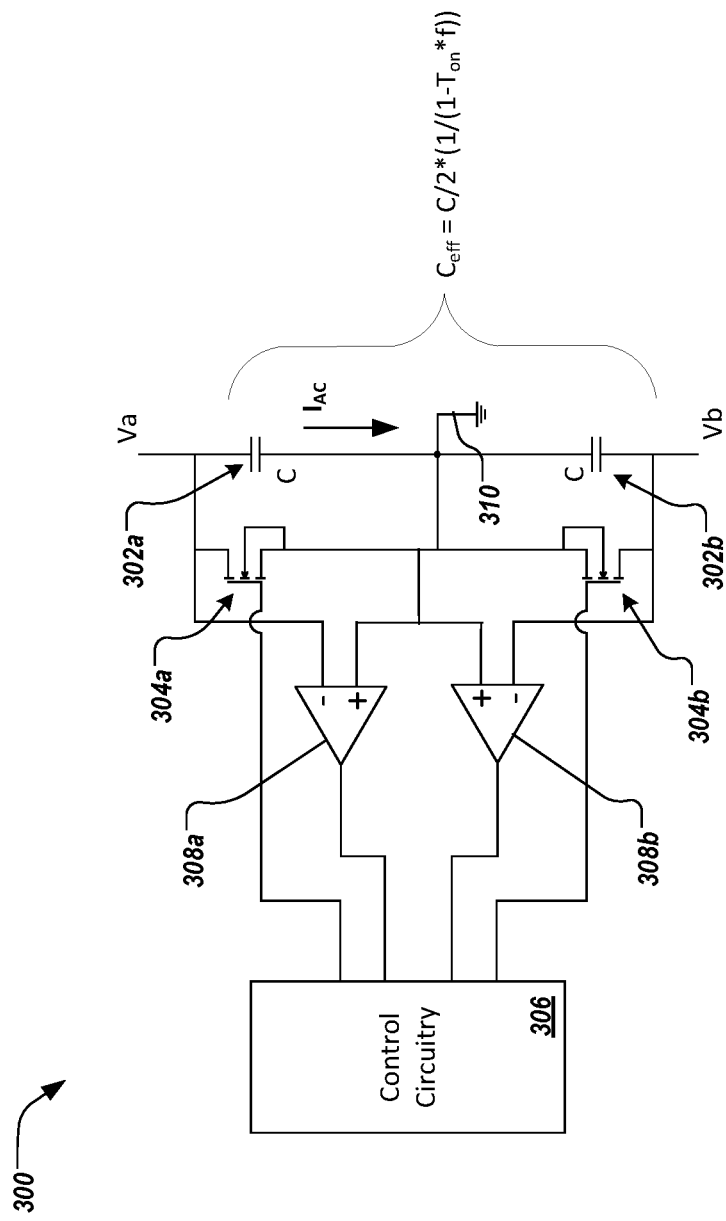
FIG. 3 depicts an example of a dynamically tunable capacitor circuit in accordance with implementations of the present disclosure.

FIG. 3 depicts an example of a dynamically tunable capacitor circuit 300. The tunable capacitor circuit 300 includes two capacitors 302a, 302b of equal capacitance (C) electrically connected in series with a ground connection 310 between them. Each capacitor 302a, 302b has an associated shorting switch 304a, 304b electrically connected in parallel with the respective capacitor 302a, 302b. The shorting switches 304a, 304b can be transistors such as, for example, metal-oxide-semiconductor field-effect transistors (MOSFET), junction gate field-effect transistors (JFET), or bipolar junction (BJT) transistors. Both the capacitors 302a, 302b and switches 304a, 304b can be ground referenced, for example, for use in high voltage circuits such as circuits including wireless power transmission coils. For example, connecting one terminal each of the capacitors 302a, 302b and each switch 304a, 304b to ground may permit the use of lower switch control voltages (e.g., less than 5 V) and eliminate a need for level shifting or other special control or isolation circuitry.

The effective capacitance of the combined capacitors 302a, 302b can be controlled by varying the period of time that the capacitors 302a, 302b are shorted during portions of a cycle of an AC input signal ($I_{AC}$) applied to the capacitors 302a, 302b. In other words, effective capacitance can be controlled by varying the period of time that the switches 304a, 304b are closed (or "ON" in the case of transistor switches ($T_{ON}$)). Together, the capacitors 302a, 302b and switches 304a, 304b are controlled so as to function as a single capacitor with an effective capacitance $$(C_{\mathit{eff}}) \text{ equal to } C_{\mathit{eff}} = \frac{C}{2}(1/(1 - T_{ON} * f)),$$

where f is the frequency (e.g., 6.78 MHz) of the AC signal ($I_{AC}$) applied to the capacitors 302a, 302b. The tunable capacitor circuit 300, thus, has a range of effective capacitance ($C_{\mathit{eff}}$) from 0 to C/2. The tuning resolution, or precision, of the tunable capacitor circuit 300 is determined by the number of possible values for $T_{ON}$ in some implementations. Thus, the tuning resolution of the tunable capacitor circuit 300 need be limited only by the timing resolution of $T_{ON}$.

Figure 4A:
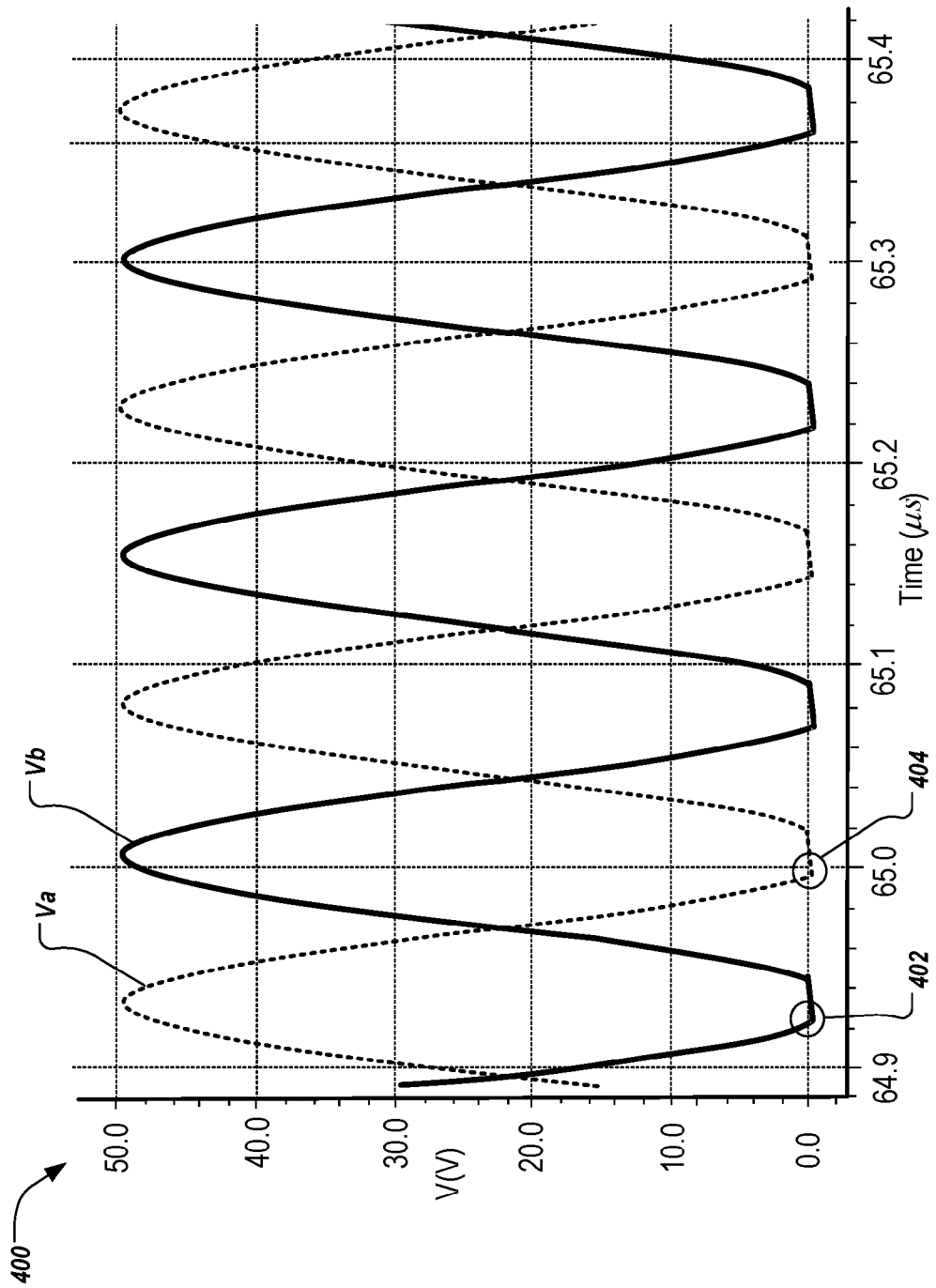
FIGS. 4A-4C depict examples of voltage signals applied to the tunable capacitor circuit.
Figure 4B:
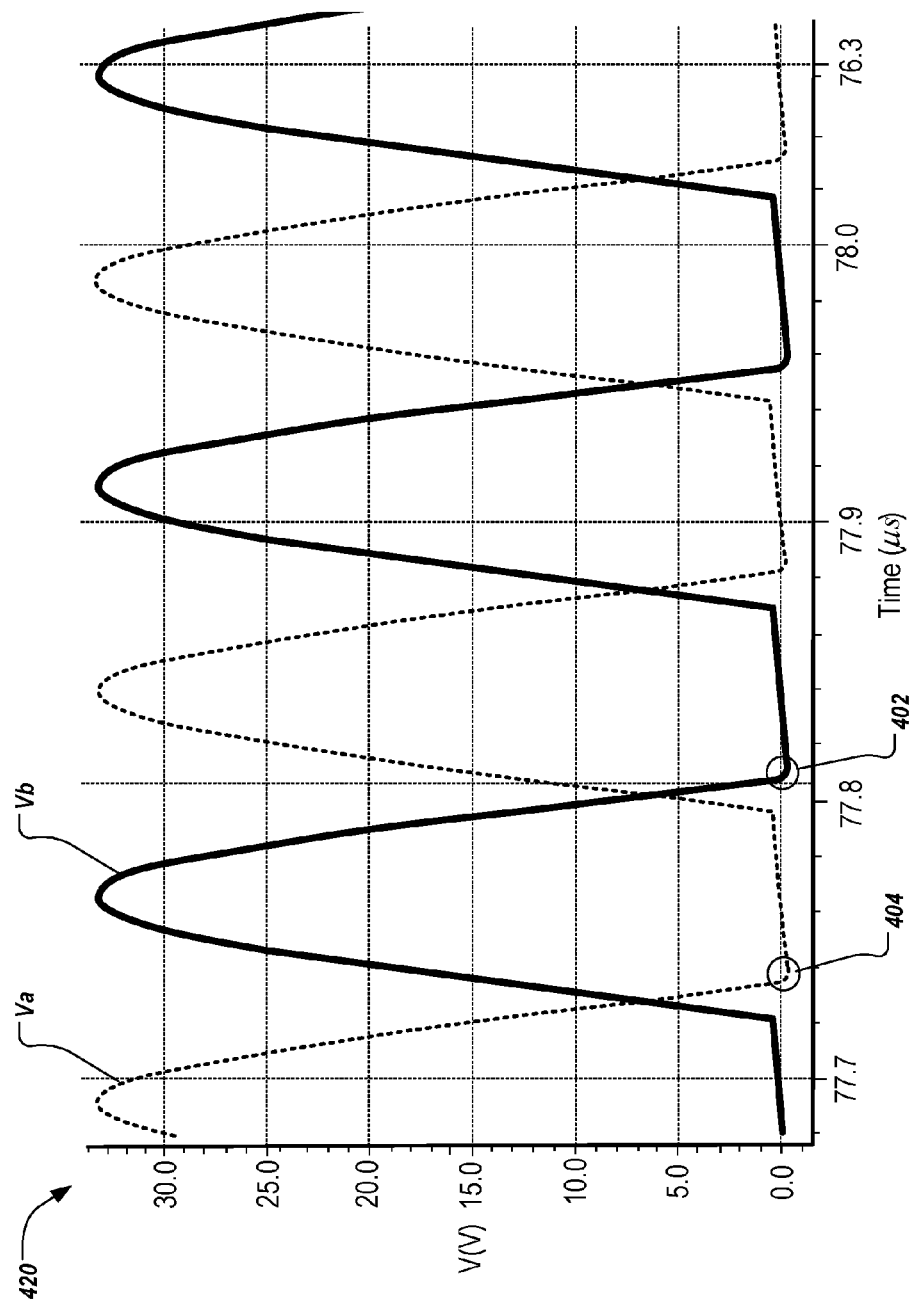
Figure 4C:
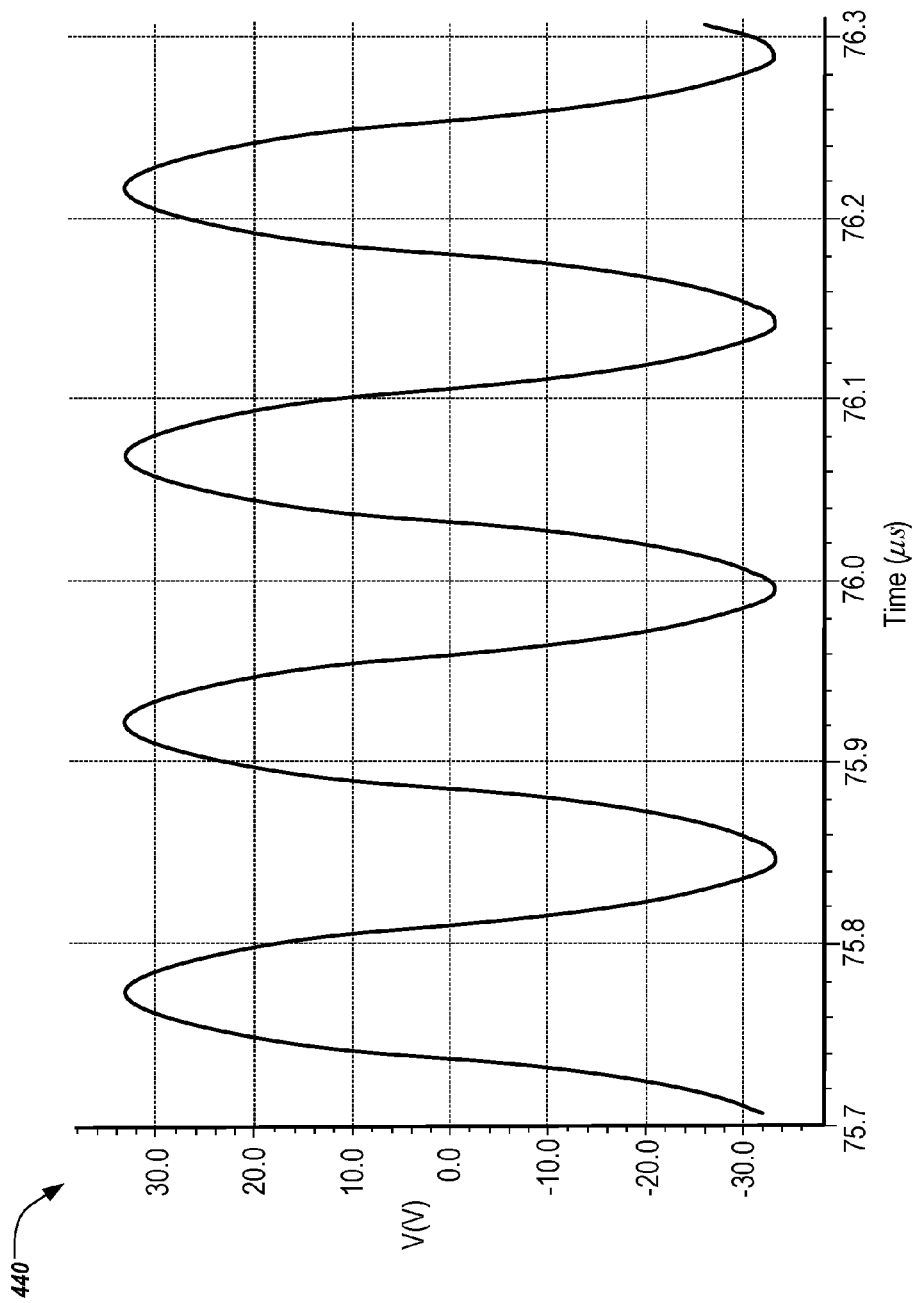

FIGS. 4A-4C depict examples of AC voltage signals applied to the tunable capacitor circuit 300. Referring to FIGS. 3, 4A, and 4B, FIGS. 4A and 4B depict graphs 400 and 420 of voltage signals at Va and Vb in the tunable capacitor circuit 300. The voltage signal at Va represents the voltage across capacitor 302a, and the voltage signal at Vb represents the voltage across capacitor 302b. The voltage signals are shown with a frequency of 6.78 MHz.

In FIG. 4A, for example, the switches 304a, 304b are closed (i.e., capacitors 302a, 302b are shorted) for 15 ns during each cycle of the voltage signals Va and Vb. In other words, $T_{ON}$ is equal to 15 ns in FIG. 4A resulting in a peak amplitude of approximately 50V. In FIG. 4B, for example, the switches 304a, 304b are closed (i.e., capacitors 302a, 302b are shorted) for 60 ns during each cycle of the voltage signals Va and Vb. In other words, $T_{ON}$ is equal to 60 ns in FIG. 4B resulting in a peak amplitude of approximately 33V. As seen by the difference in amplitude between signals Va and Vb in FIG. 4A compared to signals Va and Vb in FIG. 4B a longer $T_{ON}$ time, as shown in FIG. 4B, results in a lower effective capacitance (or effective impedance) of the tunable capacitor circuit 300 as indicated by the lower voltage drop across the respective capacitors 302a, 302b. A graph 440 of the overall voltage across the tunable capacitor circuit 300 is shown in FIG. 4C. The voltage signal in FIG. 4C represents Va-Vb, the voltage across both capacitors 302a, 302b, with a 60 ns $T_{ON}$ value.

In addition, the switches 304a, 304b can be timed to close (turn ON) when the voltage across the associated capacitor 302a, 302b (Va or Vb) crosses zero. This timing is illustrated by the zero crossings 402 and 404 of FIGS. 4A and 4B respectively and is referred to as zero voltage switching (ZVS). Precisely time switching of the switches 304a, 304b may ensure that the voltage across the tunable capacitor circuit 300 is continuous, and also prevent both large current transients and needless power losses.

Referring again to FIG. 3, the switches 304a, 304b, are controlled by control circuitry 306 coupled with respective control terminals (e.g., transistor gate terminals) of switches 304a, 304b. The control circuitry 306 controls the effective capacitance of the capacitors by controlling $T_{ON}$ of the switches 304a, 304b in accordance with a tuning input. In addition, the control circuitry 306 controls the ZVS timing of the switches 304a, 304b by monitoring the voltage or current of a signal applied to the capacitors 302a, 302b. The control circuitry 306 can include, for example, a microcontroller, a computer processor, a field programmable logic array (FPGA), or an application specific integrated circuit (ASIC). The control circuitry 306 can include or be coupled to a computer readable storage device such as, for example, random access memory, flash memory, or other appropriate memory device.

Comparators 308a, 308b can be used to detect when the voltage across the respective capacitor 302a, 302b crosses zero. For example, the input terminals of comparator 308a are electrically connected across capacitor 302a, and the input terminals of comparator 308b are electrically connected across capacitor 302b. The respective output terminals of the comparators 308a, 308b are coupled with the control circuitry 306.

The control circuitry 306 can detect the zero crossings based on the output signals of comparators 308a, 308b and, upon detecting a zero crossing, close the switches 304a, 304b for a duration of $T_{ON}$. For example, the control circuitry 306 can detect the zero crossing of the voltage across the capacitor 302a based on the rising or falling edge of the comparator's 308a output signal. In response, the control circuitry 306 can apply a control signals to the control terminal switch 304a to close the switch (e.g., turn the transistor ON) and begin shorting the capacitor 302a. After the duration $T_{ON}$ expires, the control circuitry 306 re-opens the switch 304a (e.g., turns the transistor OFF).

The $T_{ON}$ duration can be controlled by, for example, a counter that is part of the control circuitry 306. The duration of the counter ($T_{ON}$) can be set based on a tuning input signal to the control circuitry 306. For example, an IMN control circuitry 208 (shown in FIG. 2) can transmit one or more tuning control signals to the control circuitry 306. The control circuitry 306 can vary a duration of the counter ($T_{ON}$) based on the received tuning control signal(s).

The comparators 308a, 308b can produce a two-level output signal that alternates when the voltage across the respective capacitor 302a, 302b crosses zero. Moreover, the value of the comparator output signal can indicate the polarity of the voltage signals. For example, as shown in FIG. 3, the non-inverting ("+") input terminal of each comparator 308a, 308b is electrically connected to the grounded terminal of its respective capacitor 302a, 302b. The inverting ("−") input terminal of each comparator 308a, 308b is electrically connected to the other (non-grounded) terminal of its respective capacitor 302a, 302b. In this configuration, each comparator 308a, 308b will output a high signal value when the voltage across its respective capacitor 302a, 302b is negative and a low signal when the voltage across its respective capacitor 302a, 302b is positive.

In some implementations, the comparators 308a, 308b can be connected with the input terminals swapped. That is, the inverting ("−") input terminal of each comparator 308a, 308b can be electrically connected to the grounded terminal of its respective capacitor 302a, 302b. The non-inverting ("+") input terminal of each comparator 308a, 308b can be electrically connected to the other (non-grounded) terminal of its respective capacitor 302a, 302b. In such a configuration, each comparator 308a, 308b will output a high signal value when the voltage across its respective capacitor 302a, 302b is positive and a low signal when the voltage across its respective capacitor 302a, 302b is negative.

In some implementations, the effective capacitances of capacitor 302a and capacitor 302b can be tuned independently by, for example, shorting each capacitor 302a, 302b for a different duration. For example, the $T_{ON}$ associated with each capacitor 302a, 302b may be different, thereby, producing a different effective capacitance for each capacitor. Hence, the effective capacitance of capacitor 302a can be represented by $C_{eff\_a}=C_a/(1-T_{ON\_a}*f)$, the effective capacitance of capacitor 302b can be represented by $C_{eff\_b}=C_b/(1-T_{ON\_b}*f)$, and the overall effective capacitance can be represented by the series combination of $C_{eff\_a}$ and $C_{eff\_b}$.

In some implementations, the comparators 308a, 308b can be replaced by phase detection devices. For example, a voltage or current sensor (e.g., a Rogowski coils) can be used to monitor the voltage across or current through a circuit component (e.g., capacitors 302a, 302b). A phase detection device or circuitry can detect and track the phase of the voltage or current and the control circuitry 306 (e.g., a microcontroller or processor) can time the ZVS of the switches 304a, 304b based on the phase of the monitored voltage or current. For example, the control circuitry 306 can determine the zero crossings of the monitored voltage or current based on the detected phase, and control the switches 304a, 304b accordingly.

In some examples, the tunable capacitor circuit 300 can be implemented without a ground reference between the capacitors 302a, 302b. For example, the tunable capacitor circuit 300 can be isolated from high voltages using isolation circuitry, such as opto-couplers, isolation transformers, and the like, for example.

Figure 5:
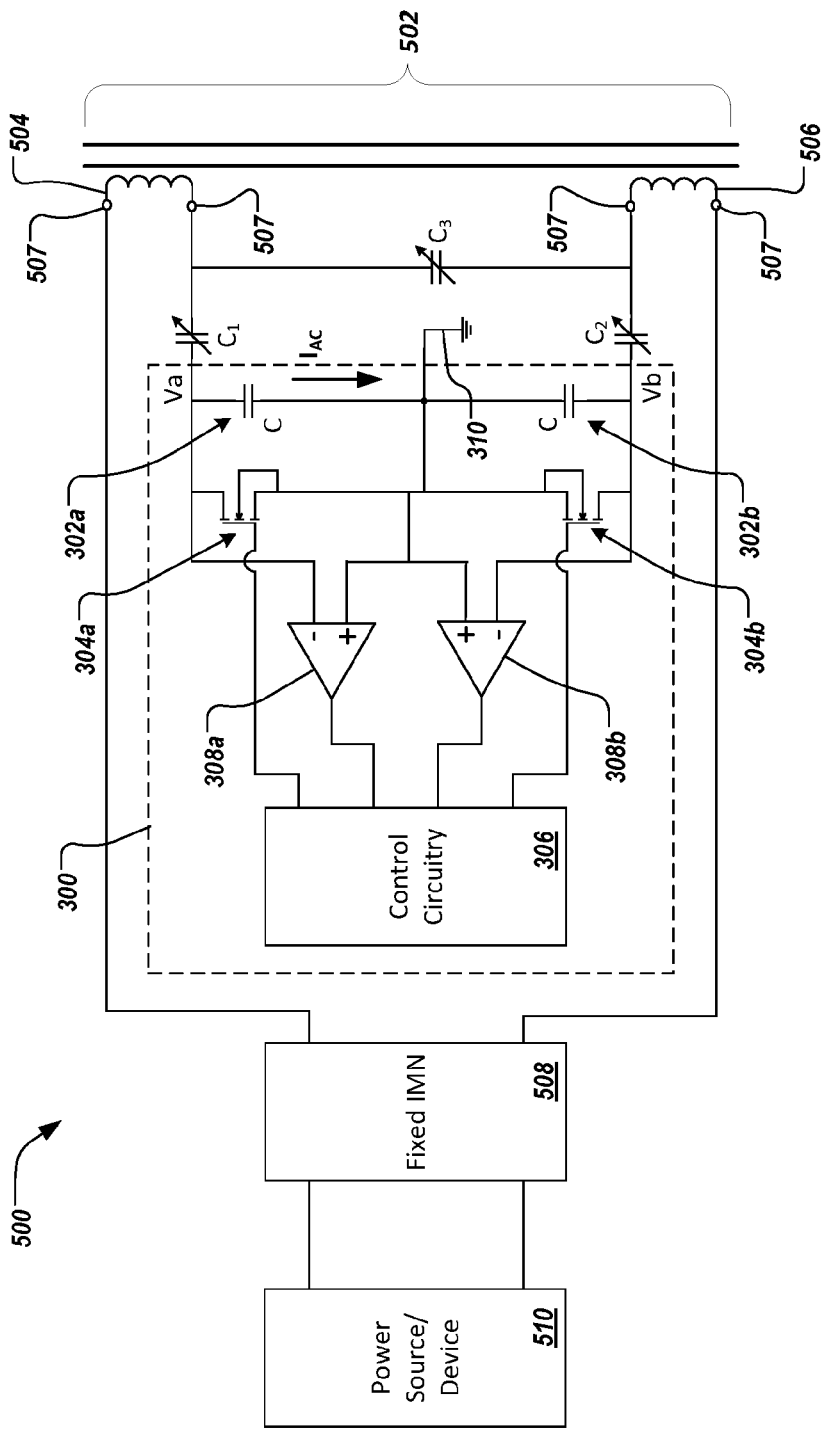
FIG. 5 depicts an example of a wireless energy transfer system including a dynamically tunable capacitor circuit.

FIG. 5 depicts an example of a wireless energy transfer system 500 including a dynamically tunable capacitor circuit 300. The wireless energy transfer system 500 includes the tunable capacitor circuit 300 of FIG. 3, a split-coil 502, an optional fixed IMN 508, and power source or device 510 that either provides power to the split-coil 502 (e.g., power source 102) or receives power from the split-coil 502 (e.g., a wirelessly powered/charged electronic device 112).

The tunable capacitor circuit 300 is coupled with the split-coil 502 and can be tuned to adapt the impedance of the wireless energy transfer system 500 to a varying impedance of the split-coil 502. As described in reference to FIG. 1 above, the split-coil 502 can be used to wirelessly transfer energy to or receive energy from another resonator coil (e.g., a corresponding device or source resonator coil, respectively). The effective impedance of the split-coil 502 may vary dynamically based on, for example, environmental factors (e.g., interfering objects), orientation between resonator coils, distance between resonator coils, etc. The tunable capacitor circuit 300 can be adjusted to compensate for such variations in the effective impedance of the split-coil 502.

The split-coil 502 includes two windings 504 and 506 that are coupled so as to function as one resonator coil. In embodiments, the two windings 504 and 506 are magnetically coupled. In some implementations, the split-coil 502 can be two separate coils coupled by a capacitor. Each winding 504, 506 has two input terminals 507. The tunable capacitor circuit 300 is connected in series between the windings 504, 506 to one input terminal 507 of each winding 504, 506. The split-coil design allows for a ground-reference point to be established between the windings 504, 506 of the split-coil 502. As a result, impedance matching circuitry such as the tunable capacitor circuit 300 and capacitors $C_1$, $C_2$, and $C_3$ can be connected to the resonator 502 and operated at lower voltages without the need of isolation circuits such as galvanic isolation circuits.

The wireless energy transfer system 500 also can include capacitors $C_1$, $C_2$, and/or $C_3$. These capacitors can be either fixed or variable capacitors. Each of capacitors $C_1$, $C_2$, and $C_3$ can represent, for example, a number or combination of varactors, varactor arrays, capacitor banks, air gap capacitors, compression capacitors, barium zirconium titanate (BZT) electrically tunable capacitors, or microelectromechanical systems (MEMS)-tunable capacitors. For example, capacitors $C_1$, $C_2$, and/or $C_3$ can represent a coarsely adjustable impedance matching network used in combination with the tunable capacitor circuit 300. For instance, capacitors $C_1$, $C_2$, and/or $C_3$ can be used to grossly tune a circuit to a known dynamic impedance range or can provide coarse impedance adjustments while the tunable capacitor circuit 300 provides fine impedance adjustments. For example, the capacitors $C_1$, $C_2$, and/or $C_3$ can permit coarse impedance adjustments within a dynamic impedance range and the tunable capacitor circuit 300 can be used to perform fine impedance adjustments.

Although circuit elements $C_1$, $C_2$, and/or $C_3$ are represented and described as capacitors, in some implementations, they can be replaced by or used in combination with other impedance matching components. For example, capacitors $C_1$, $C_2$, and/or $C_3$ can be replaced by or used in combination with inductors, diodes, and resistors.

As noted above, in some implementations, the effective capacitances of capacitor 302a and capacitor 302b can be tuned independently by, for example, shorting each capacitor 302a, 302b for a different duration. For example, when combined with a split-coil 502, independent tuning of capacitors 302a, 302b may be used to correct for imbalances in the respective windings 504, 506 of the split-coil 502. For example, a second resonator coil (e.g., a resonator coil to which power is being transferred) may be placed next to the split-coil 502, but misaligned slightly so as to create an impedance imbalance between the windings 504, 506. For example, the impedance of winding 504 may become more inductive than that of winding 506. The wireless energy transfer system 500 can correct for such imbalance by, for example, adjusting $T_{ON\_a}$ to increase the effective capacitance of capacitor 302a, adjusting $T_{ON\_b}$ to decrease the effective capacitance of capacitor 302b, or adjusting $T_{ON\_a}$ and $T_{ON\_b}$ in combination to re-balance the windings 504, 506.

The fixed IMN 508 can include, for example, a capacitor or networks of capacitors, an inductor or networks of inductors, or various combinations of capacitors, inductors, diodes, and resistors. For example, the fixed IMN 508 may provide impedance matching between portions of the system 500 with static impedances or to grossly tune the system 500 to a known dynamic impedance range (e.g., a dynamic impedance range of the split-coil 502).

Figure 6:
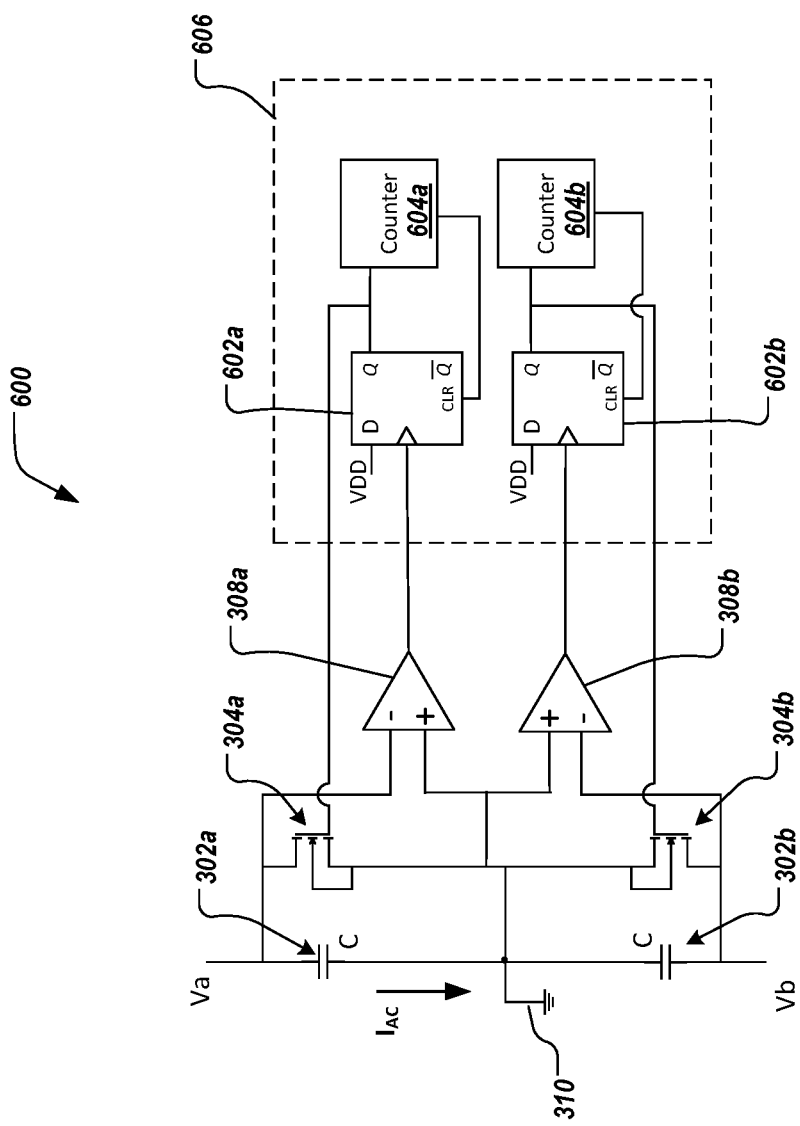
FIG. 6 depicts the dynamically tunable capacitor circuit with an example of a first implementation of the control circuitry.

FIG. 6 depicts the dynamically tunable capacitor circuit 600 with an example of a first implementation of the control circuitry 606. The control circuitry 606 includes a flip-flop 602a, 602b and a $T_{ON}$ counter 604a, 604b associated with each capacitor 302a, 302b. The flip-flops 602a, 602b are illustrated as D flip-flops, however, they may be implemented using other types of flip-flops or gated latch circuits. As illustrated in FIG. 6, the control circuitry 606 is symmetric, so, for simplicity, the control circuitry will be described in the context of one capacitor (capacitor 302a).

The comparator 308a and the flip-flop 602a in combination control the ZVS of the switch 304a. The comparator 308a changes the state of its output signal when the voltage across the capacitor 302a (Va) crosses zero, as described above in reference to FIG. 3. The comparator 308a output signal is applied to an edge triggered gating (clock) input of the flip-flop 602a. The input (D) of the flip-flop 602a is tied to a high (e.g., 5V) input signal VDD (e.g., 5V). The output terminal (Q) of the flip-flop 602a is electrically connected to the control terminal of the switch 304a (e.g., transistor gate) and a counter-start terminal of the $T_{ON}$ counter 504a. When the flip-flop 602a detects an appropriate edge (rising or falling) in the comparator 308a output signal, the flip-flop turns switch 304a ON to short capacitor 302a and triggers the $T_{ON}$ counter 604a to begin timing the duration $T_{ON}$.

An output terminal of the $T_{ON}$ counter 604a is electrically connected to the CLR input terminal of the flip-flop 602a. Upon expiration of the duration $T_{ON}$, the $T_{ON}$ counter 604a generates a CLR signal to clear the output of the flip-flop 602a (e.g., reset to low or "0"), thereby, turning the switch 304a OFF. In addition, the $T_{ON}$ counter 604a can receive a tuning input signal to set the duration of $T_{ON}$ and control the effective capacitance of the capacitor 302a. Furthermore, the resolution of the effective capacitance for capacitor 302a is determined by the count increment of the $T_{ON}$ counter 604a. For example, a $T_{ON}$ counter 604a having a smaller count increment will allow for more precise control of the effective capacitance of the capacitor 302a.

Figure 7:
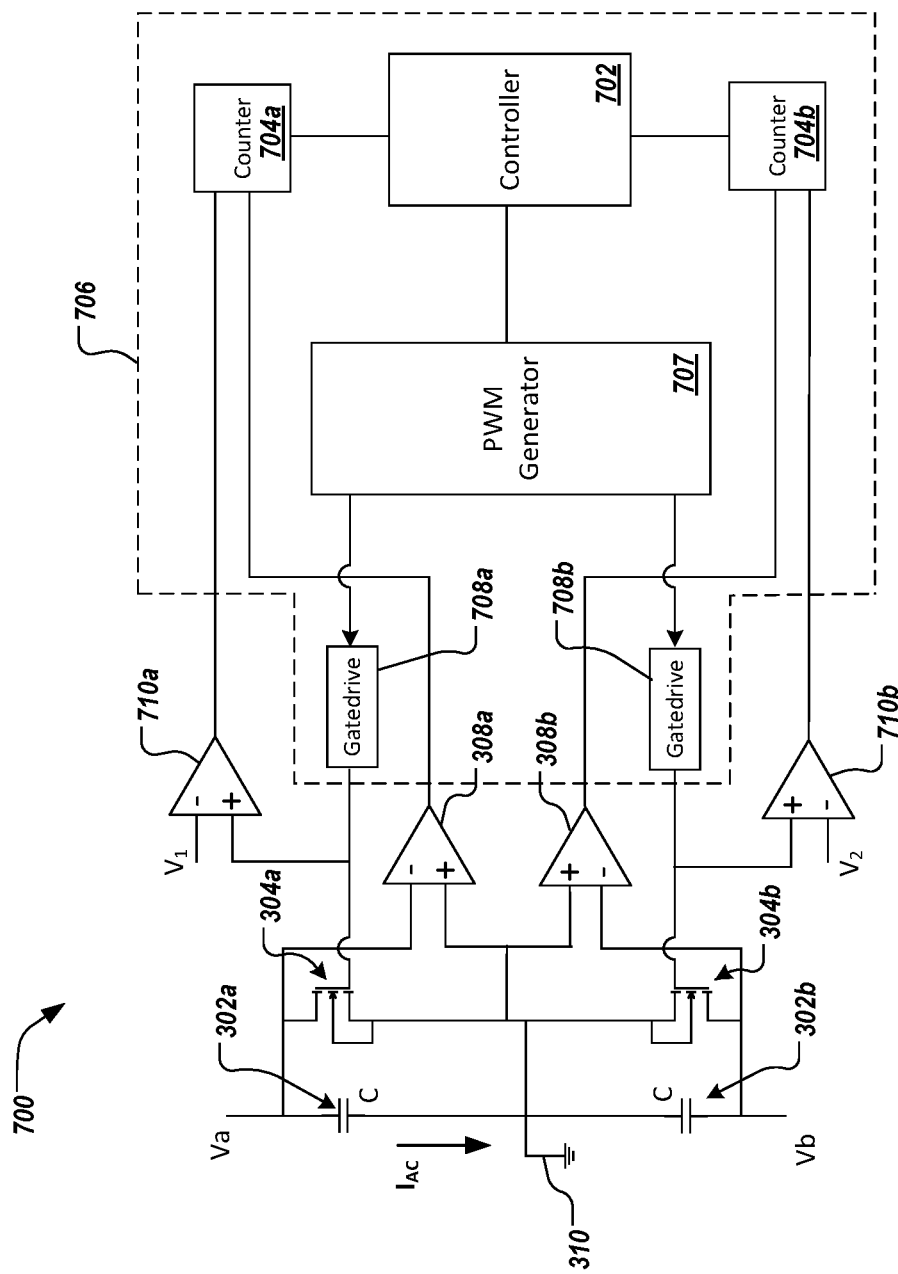
FIG. 7 depicts the dynamically tunable capacitor circuit with an example of a second implementation of the control circuitry.

FIG. 7 depicts the dynamically tunable capacitor circuit 700 with an example of a second implementation of the control circuitry 706. The control circuitry 706 includes a controller 702, counters 704a, 704b, a pulse width modulation (PWM) generator 707 and gate drivers 708a, 708b. The tunable capacitor circuit 700 is similar to that described in reference to FIG. 3, and includes an additional set of comparators 710a, 710b.

The controller 702 can be, for example, a microcontroller, a computer processor, an FPGA, or an ASIC. The controller 702 can include or be coupled to a computer readable storage device such as, for example, random access memory, flash memory, or other appropriate memory device. In some examples, the counters 704a, 704b can be internal counters in the controller 702. The controller 702 receives one or more input tuning signals and controls the PWM generator 707 to adjust the effective capacitance of the capacitors 302a, 302b based on the input tuning signal(s).

The PWM generator 707 generates PWM signals used to control the switches 304a, 304b. The ON timing, or ZVS timing, of the switches 304a, 304b is controlled by the phase of the PWM signals and the OFF timing, or $T_{ON}$, is controlled by the duty cycle of the PWM signals. For example, the duty cycle is increased to increase the $T_{ON}$ duration and reduced to decrease the $T_{ON}$ duration. The period of the PWM signals is configured to match that of the signal applied to the capacitors 302a, 302b (Va, Vb). Thus, for example, for a 6.78 MHz signal applied to the capacitors 302a, 302b, the period of the PWM signals would be approximately 147.5 ns. The gate drivers 708a, 708b amplify the PWM signals as applicable to operate the switches 304a, 304b.

As described in reference to control circuitry 306 of FIG. 3, the control circuitry 706 controls the ZVS of the switches 304a, 304b and the effective capacitance of the capacitors 302a, 302b by controlling the shorting duration $T_{ON}$. In addition, the control circuitry 706 adjusts the ZVS timing for turning the switches 304a, 304b ON to account for switching control delays. For example, electronic circuitry has some inherent signal processing and propagation delays, which become more readily apparent when circuits are operated at higher frequencies because delay times represent greater portions of operating signal periods. The control circuitry 706 can monitor such delays and adjust the ZVS timing for the switches 304a, 304b accordingly.

The comparators 710a, 710b are used to monitor the control signals applied to the switches 304a, 304b. More specifically, when transistors (e.g., MOSFETs) are used for the switches 304a, 304b, the comparators 710a, 710b can be configured to monitor for a voltage slightly below the threshold voltage, for example, the threshold voltage less a voltage offset ($\delta$) ($V_{th}$—$\delta$). The magnitude of the voltage offset ($\delta$) is less than the magnitude of the threshold voltage ($V_{th}$) of the associated transistor.

For example, as shown in FIG. 7, the non-inverting ("+") input terminal of each comparator 710a, 710b is electrically connected to the control terminal (e.g., gate) of its respective switch 304a, 304b. The inverting ("−") input terminal of each comparator 710a, 710b is electrically connected to a reference voltage $V_1$ or $V_2$ for the respective switch 304a, 304b. The reference voltages, $V_1$ and $V_2$, can be set at the threshold voltage ($V_{th}$) of the associated switch 304a, 304b or the threshold voltage less a voltage offset ($V_{th}-\delta$). In this configuration, each comparator 710a, 710b will output a high signal value when the voltage of the gate drive signal for its respective switch 304a, 304b exceeds the applicable reference voltage $V_1$ or $V_2$, thereby, indicating that the respective switch 304a, 304b is ON.

As illustrated in FIG. 7, the control circuitry 706 is symmetric, so, for simplicity, the control circuitry will be described in the context of controlling only one of the switch/capacitor pairs (switch 304/capacitor 302a). The counter 704a and controller 702 control the ZVS timing for the switch 304a. The counter 704a receives timing input signals from both comparator 308a and comparator 710a. As described above, the output signal of comparator 308a indicates when the voltage across the capacitor 302a (Va) crosses zero, and the output signal of comparator 710a indicates when the switch 304a turns ON. The counter 704a measures the delay in turning the switch 304a ON ("switching delay") by measuring the timing difference between the output signals of comparator 308a and comparator 704a. For example, the counter 704a can initiate a timer when an appropriate edge (rising or falling) of the output signal from comparator 308a is received, and stop the timer when the output signal of comparator 710a indicates that sufficient drive voltage is being applied to switch 304a to turn switch 304a ON.

The measured switching delay is provided to the controller 702. The controller 702 provides control signals to the PWM generator 707 to shift the phase of the PWM signal sent to gate driver 708a in order to decrease the switching delay for switch 304a. For example, the phase of the PWM signal sent to gate driver 708a can be advanced by an amount equivalent to the measured switching delay. In some examples, the controller 702 can monitor the switching delay each time the switch 304a is turned ON, and make adjustments to the PWM signal as appropriate. In some examples, the controller 702 can adjust the PWM signal until the switching delay is minimized. That is, the controller 702 can adjust the PWM signal until the switching delay is zero or approximately zero within the limitations of the circuit components (e.g., within the precision of the counters 704a, 704b).

Figure 8:
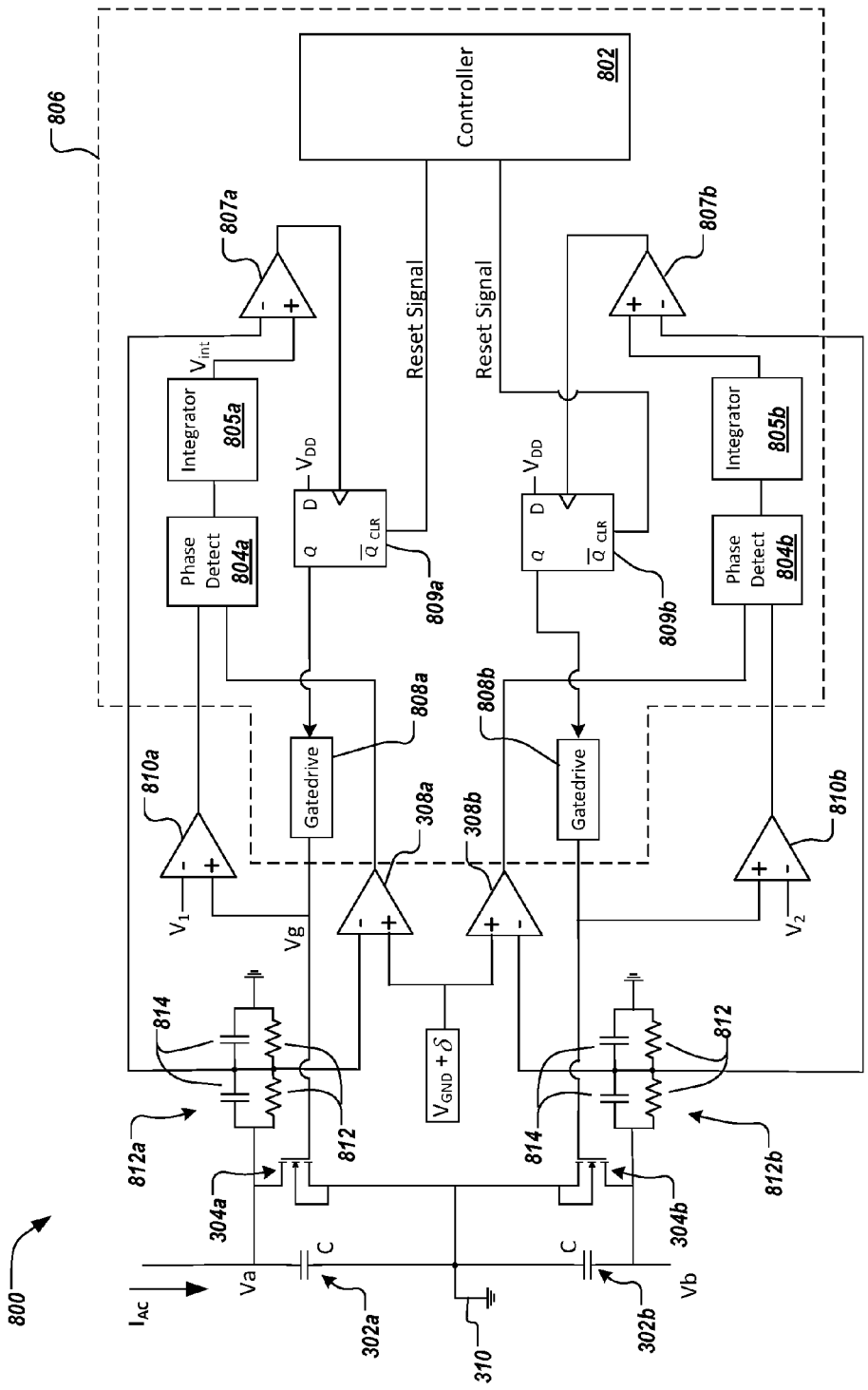
FIG. 8 depicts the dynamically tunable capacitor circuit with an example of a third implementation of the control circuitry.

FIG. 8 depicts the dynamically tunable capacitor circuit 800 with an example of a third implementation of the control circuitry 806. The control circuitry 806 includes a controller 802, phase detection circuits 804a, 804b, integrator circuits 805a, 805b, comparators 807a, 807b, flip-flops 809a, 809b, and gate drivers 808a, 808b. The tunable capacitor circuit 800 is similar to that described in reference to FIG. 3, and includes voltage divider circuits 812a, 812b and an additional set of comparators 810a, 810b.

The controller 802 can be, for example, a microcontroller, a computer processor, an FPGA, or an ASIC. The controller 802 can include or be coupled to a computer readable storage device such as, for example, random access memory, flash memory, or other appropriate memory device. In some examples, the controller 802 can be a PWM generator.

As described in reference to control circuitry 306 of FIG. 3, the control circuitry 806 controls the ZVS of the switches 304a, 304b and the effective capacitance of the capacitors 302a, 302b by controlling the shorting duration $T_{ON}$. In addition, the control circuitry 806 adjusts the ZVS timing for turning the switches 304a, 304b ON to account for switching control delays. For example, electronic circuitry typically has at least some inherent signal processing and propagation delays, which become more readily apparent when circuits are operated at higher frequencies because delay times represent greater portions of operating signal periods. The control circuitry 806 can monitor such delays and adjust the ZVS timing for the switches 304a, 304b accordingly.

The comparators 810a, 810b monitor the control signals applied to the switches 304a, 304b. More specifically, when transistors (e.g., MOSFETs) are used for the switches 304a, 304b, the comparators 810a, 810b detect when the gate drive signals meet the threshold voltage ($V_{th}$) of the associated transistor. In some examples, the comparators 810a, 810b monitor for a voltage slightly below the threshold voltage, for example, the threshold voltage less a voltage offset ($\delta_{th}$) Vth-$\delta_{th}$. The voltage offset ($\delta_{th}$) can be positive if soft switching is desired, or negative if hard switching is desired. The magnitude of the voltage offset ($\delta_{th}$) is less than the magnitude of the threshold voltage ($V_{th}$) of the associated transistor.

For example, as shown in FIG. 8, the non-inverting ("+") input terminal of each comparator 810a, 810b is electrically connected to the control terminal (e.g., gate) of its respective switch 304a, 304b. The inverting ("−") input terminal of each comparator 810a, 810b is electrically connected to a reference voltage $V_1$ or $V_2$ for the respective switch 304a, 304b. The reference voltages, $V_1$ and $V_2$, can be set at the threshold voltage ($V_{th}$) of the associated switch 304a, 304b or the threshold voltage less a voltage offset (Vth-$\delta_{th}$). In this configuration, each comparator 810a, 810b will output a high signal value when the voltage of the gate drive signal (Vg) for its respective switch 304a, 304b exceeds the applicable reference voltage $V_1$ or $V_2$, thereby, indicating that the respective switch 304a, 304b is ON. In some implementations, the reference voltages $V_1$ or $V_2$ are equal. Further, in some implementations, the inverting input terminals of both comparator 810a and 810b can be electrically connected to a common reference voltage (e.g., $V_1$ or $V_2$). Alternatively, reference voltages $V_1$ and $V_2$ can be different and can be provided as independent reference voltages.

The voltage divider circuits 812a, 812b are optionally used in tunable capacitor circuits 800 that operate at high voltages that would otherwise damage comparators 308a, 308b, 807a, and 807b, and possible other portions of the control circuitry 806. The voltage divider circuits 821a, 812b step the operating voltages of the tunable capacitors circuits 800 (e.g., Va and Vb) down to voltage levels that the control circuitry 806 can manage without incurring damage. Each voltage divider circuit 812a, 812b includes a network of resistive elements 816 and impedance elements 814 (e.g., capacitors and/or inductors) of appropriate values to step down the voltage from the tunable capacitor circuit for control circuitry 806. Although the voltage divider circuits 812a, 812b are illustrated expressly in FIG. 8, they can be included in any of the preceding implementations as well.

As illustrated in FIG. 8, the control circuitry 806 is symmetric, so, for simplicity, the control circuitry will be described in the context of controlling only one of the switch/capacitor pairs (switch 304a/capacitor 302a). However, it should be understood that the following discussion applies equally to the control of other switch capacitor pairs (e.g., switch 304b/capacitor 302b). The phase detection circuit 804a is coupled with the output terminals of comparator 308a and 810a and receives the output signals of comparator 308a and 810a as the phase detection circuit 804a input signals. The output of the phase detection circuit 804a is coupled with the input to the integrator circuit 805a.

Together, the phase detection circuit 804a and the integrator circuit 805a generate a reference voltage ($V_{int}$) input to comparator 807a.

The comparator 807a monitors the voltage across the switch 304a and capacitor 302a (Va) with respect to the reference voltage ($V_{int}$) generated by the phase detection circuit 804a and integrator circuit 805a. The non-inverting ("+") input terminal of comparator 807a is coupled with the integrator circuit 805a. The inverting ("−") input terminal of comparator 807a is electrically connected to the non-grounded terminals of the switch 304a and the capacitor 302a. Consequently, the comparator 807a inverts its output signal when the signal at the inverting input terminal (e.g., voltage Va or Va divided by the optional voltage divider circuit 812a) falls below the reference voltage ($V_{int}$).

The flip-flop 809a receives the output signal of comparator 807a at an edge triggered clock terminal. The rising edge of the comparator 807a output signal causes the flip-flop 809a to output the voltage signal (VDD) applied to the input terminal (D) of the flip-flop 809a, thereby, turning on the switch 304a. The output terminal (Q) of the flip-flop 809a is electrically connected to the control terminal of the switch 304a (e.g., transistor gate) through the optional gate driver 808a. The controller 802 is coupled with the reset terminal (CLR) of the flip-flop 809a and sends a reset signal to the flip-flop 809a to open (or turn OFF) the switch 304a after the capacitor shorting duration $T_{ON}$.

In operation, the phase detection circuit 804a, integrator circuit 805a, and comparator 807a control when the switch 304a closes (e.g., a transistor turns ON). In other words, the phase detection circuit 804a, integrator circuit 805a, and comparator 807a control the ZVS timing for the switch 304a. The phase detection circuit 804a and integrator circuit 805a adaptively generate a reference voltage ($V_{int}$) for the comparator 807a that accounts for the control circuitry's 806 switching delay. The reference voltage ($V_{int}$) is established so as to cause the comparator 807a to begin the switching process (the process of turning switch 304a ON) an appropriate amount of time before the voltage across the switch 304a and capacitor 302a (Va) crosses zero such that the switch 304a will begin conducting (turn ON) at the zero crossing instead of, for example, several nanoseconds afterwards. The comparator 807a monitors the voltage across the switch 304a and capacitor 302a (Va) and inverts its output signal when Va (or Va divided by the optional voltage divider circuit 812a) falls below the output voltage of the of the integrator circuit 805a ($V_{int}$), thereby, causing the flip-flop 809a to turn on the switch 304a.

More specifically, as noted above, comparator 308a monitors the voltage across the capacitor 302a. When the voltage (Va) across capacitor 302a (and switch 304a) is at (or near) zero, the output signal of comparator 308a switches states. Thus, the output signal of comparator 308a is timed to the zero crossings of the voltage across the capacitor 302a and switch 304a. Also, as noted above, comparator 810a monitors the control signal applied to switch 304a. When the voltage at the control terminal of switch (Vg) is at or exceeds the threshold voltage ($V_1$), the output signal of comparator 810a switches states. The threshold voltage ($V_1$) is set at or just below the voltage required to turn switch 304a ON, thus, the output signal of comparator 810a is timed to indicate when the switch 304a turns ON.

The phase detection circuit 804a determines a phase difference between output signals from comparator 308a and comparator 810a, which represents the time delay between when the comparator 308a detects the voltage Va crossing zero and when the switch 304a actually turns ON to short out the capacitor 302a. The phase detection circuity 804a outputs a voltage signal proportional to this phase difference each time the switch 304a is turned ON. The integrator circuit 805a sums the phase detection circuity 804a output signals, the result of which is provided as a reference voltage ($V_{int}$) for the non-inverting input terminal of comparator 807a. Because the reference voltage ($V_{int}$) applied to comparator 807a is slightly above zero, the comparator 807a will begin the switching process for switch 304a before the voltage Va actually crosses zero. This provides sufficient time for the voltage at the control terminal of switch 304a to build up to a value sufficient to turn the switch 304a ON when the voltage Va does cross zero.

Figure 9A:
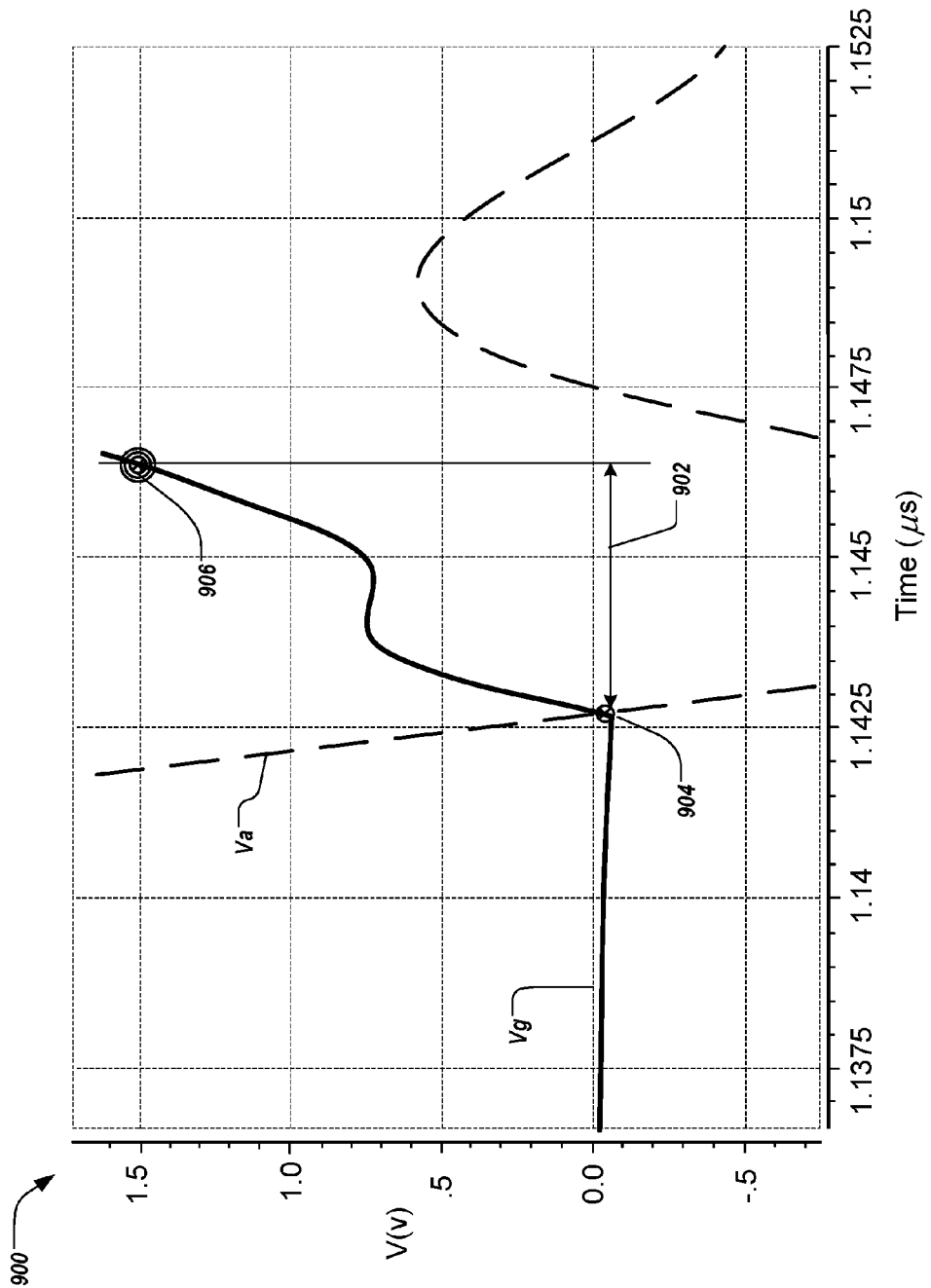
FIGS. 9A-9D depict graphs of exemplary control signals in the control circuitry of the third implementation.

FIGS. 9A-9D depict graphs of exemplary control signals in the control circuitry 806. FIG. 9A depicts a graph 900 of the voltage across the switch 304a and capacitor 302a (Va) and the voltage applied to the control terminal of switch 304a (Vg) at 1 µs after applying a voltage signal to the tunable capacitor circuit 800. The voltage signal Va is a 6.78 MHz sinusoidal signal. The graph 900 shows the signals Va and Vg before the control circuitry 806 has had time to adjust for the switching delay 902. At point 904 Va crosses zero volts and the control circuitry 806 begins applying the gate voltage (Vg) to the control terminal of the switch 304a. However, the gate voltage (Vg) does not reach the threshold voltage (e.g., 1.5 V) of the switch 304a until point 906. Therefore, due to the switching delay 902, the voltage across the switch 304a and capacitor 302a (Va) is allowed to drop significantly below zero volts before the switch 304a turns on at point 906. The total switching delay 902 is approximately 3.63 ns and represents approximately 2.5% of the period of the voltage signal Va.

Figure 9B:
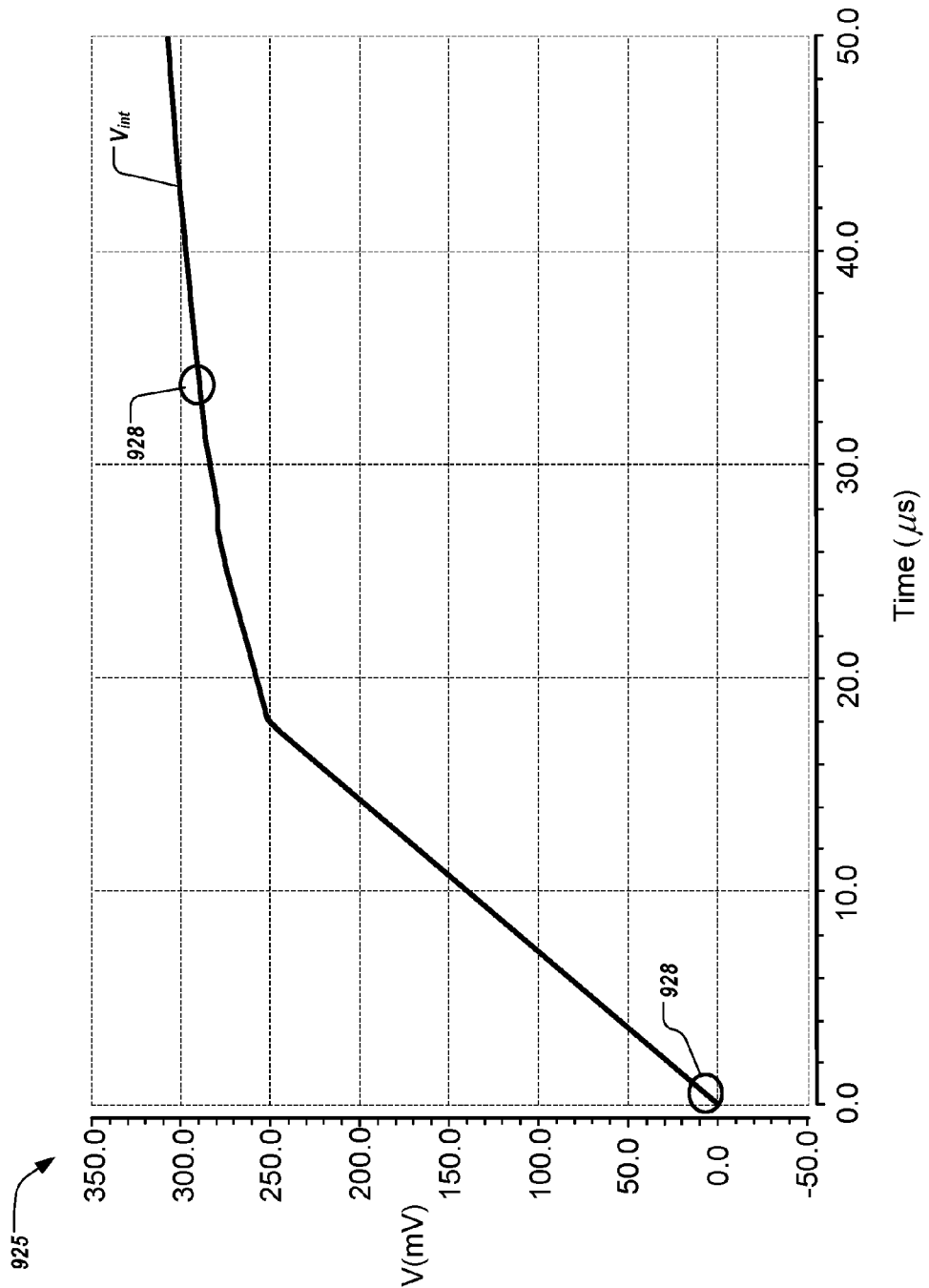

However, over a short period of time the phase detection circuit 804a and integrator circuit 805a adjust the reference voltage ($V_{int}$) of comparator 807a to account for the switching delay 902 to shift point 904 and begin applying the gate voltage (Vg) to the switch 304a earlier in time. For example, FIG. 9B depicts a graph 925 showing an example of the integrator circuit 805a output signal ($V_{int}$) (also the reference voltage for comparator 807a) varying over time. At 1 µs after applying a voltage signal to the tunable capacitor circuit 800 (point 926), the voltage signal $V_{int}$ is relatively small. Thus, comparator 807a is not triggering the flip-flop 809a to turn on the switch until the voltage across the switch 304a and capacitor 302a (Va) is already too close to zero to account for the switching delay. The voltage signal $V_{int}$ begins to plateau at approximately 18 µs and ZVS is fairly achieved at approximately 34 µs after applying a voltage signal (point 928). Note that continuous reduction in the slope of the voltage signal $V_{int}$ illustrates the decreasing phase difference between the output signals of comparators 308a and 810a as the switch timing approaches ZVS.

Figure 9C:
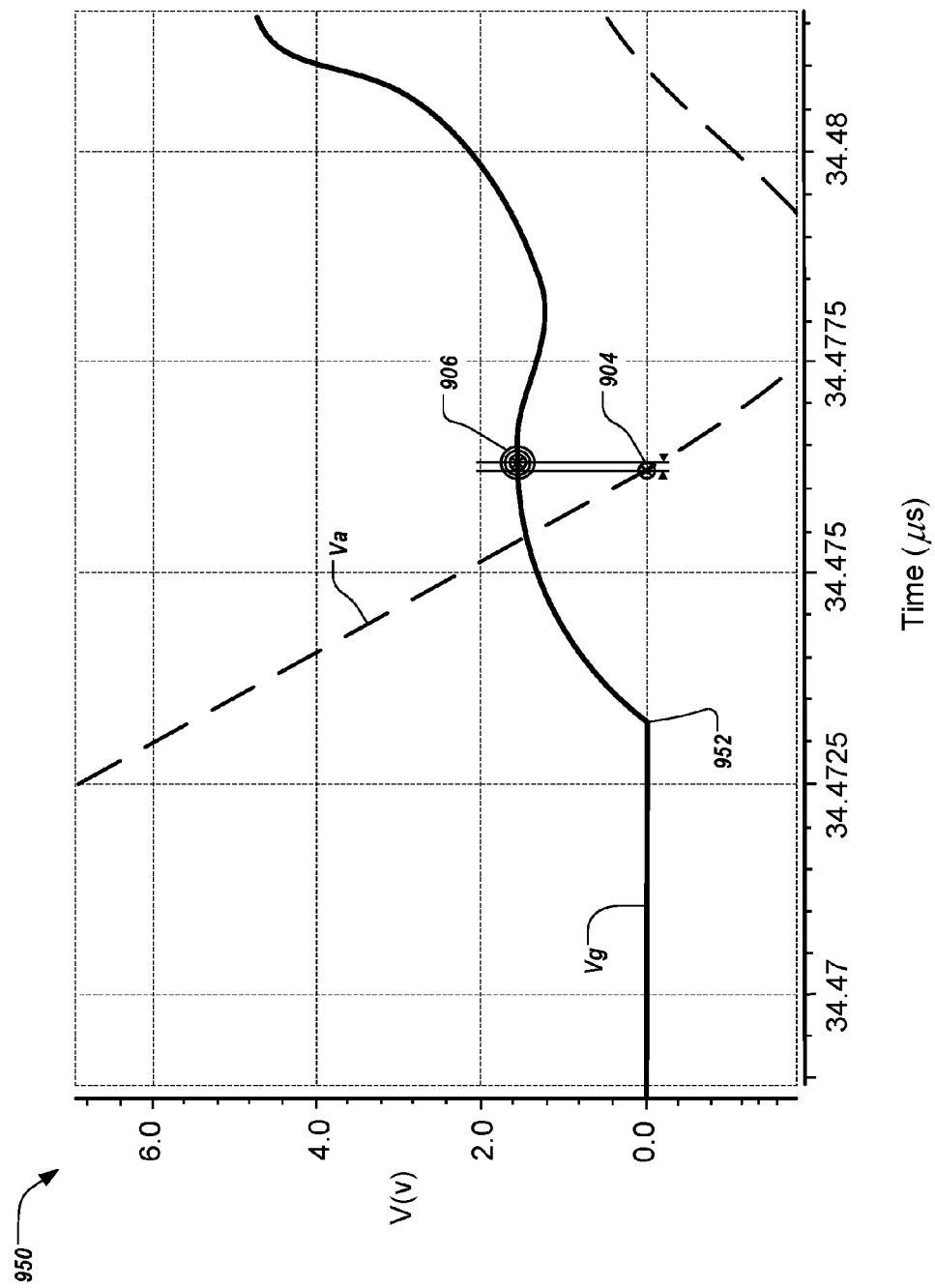

FIG. 9C depicts a graph 950 of the voltage across the switch 304a and capacitor 302a (Va) and the voltage applied to the control terminal of switch 304a (Vg) at approximately 34 µs after applying a voltage signal to the tunable capacitor circuit 800. Here, the control circuitry 806 begins applying the gate voltage (Vg) to the control terminal at point 952 of the switch 304a when the voltage Va is approximately 5.5 V. Thus, the gate voltage Vg reaches the threshold voltage (e.g., 1.5 V) of the switch 304a at point 906 within approximately 20 ps of when the voltage signal Va crosses zero (point 904). The voltage signal Va still drops slightly below zero, however, more due to ringing than switching delay.

Referring again to FIG. 8, the controller 802 controls the capacitor shorting duration ($T_{ON}$) (e.g., the time that the switch 304a is maintained ON). For example, the controller 802 can include a timer that is triggered to start when the switch 304 is turned ON. At the expiration of the timer the controller 802 sends a reset signal to the flip-flop 809a causing the flip-flop 809a to turn the switch 304a OFF by, for example, ceasing to apply the required voltage to the control terminal of the switch 304a. The controller 802 can vary the value of $T_{ON}$ based on an input signal received by the controller 802. For example, the controller 802 may receive the input signal from an impedance matching network control circuit.

Figure 9D:
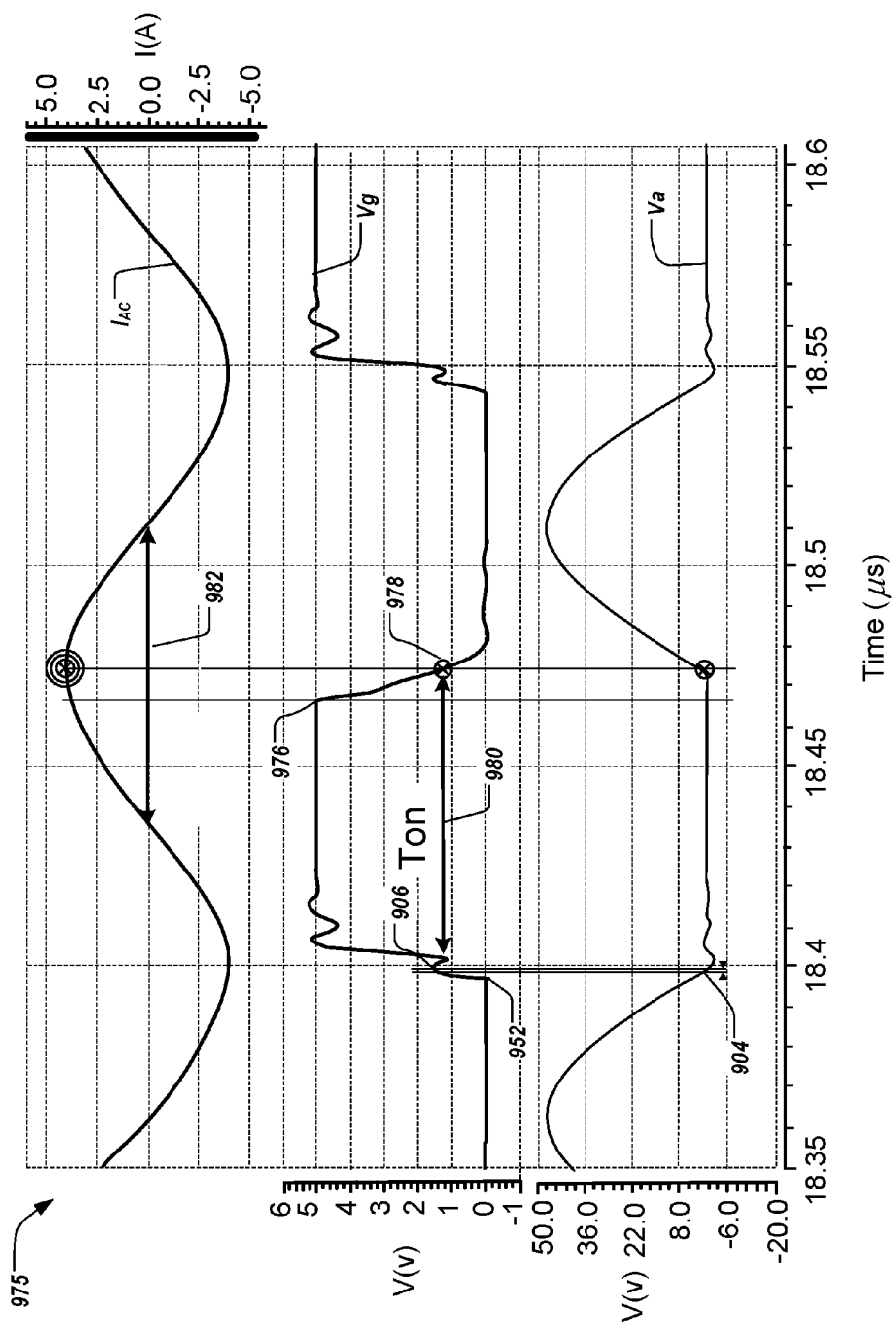

FIG. 9D depicts a graph 975 of the current ($I_{AC}$) flowing into capacitor 302a and the switch 304a, the voltage across the switch 304a and capacitor 302a (Va), and the voltage applied to the control terminal of switch 304a (Vg). Graph 975 illustrates the full operation of control circuitry 806. At point 952 the control circuitry 806 begins to apply a gate voltage signal (Vg) to the control terminal of the switch 304a, slightly before the voltage signal Va crosses zero at point 904. At point 906 the value of the gate voltage signal Vg is sufficient to turn the switch 304a ON. The controller 802 resets the flip-flop 809a at point 976 after the shorting duration ($T_{ON}$) 980 expires. At point 978 the gate voltage signal decays sufficiently to turn the switch 304a OFF and the capacitor 302a begins to charge. The controller 802 turns switch 304a OFF during the positive half 982 of the current $I_{AC}$ so that the voltage signal Va is rising.

Referring back to FIG. 8, in some implementations the controller 802 can be a PWM generator. In such implementations, the PWM generator can output a PWM signal to the reset terminal of the flip-flop 809a. The shorting duration ($T_{ON}$) can be controlled by the PWM signal. For example, the frequency of the PWM signal can be matched to that of the voltage signal Va applied to the capacitor 302a and the switch 304a. The shorting duration ($T_{ON}$) can be controlled by the phase of the PWM signal pulse relative to the phase of the voltage signal Va. For example, the amount of phase delay between the rising edge of the PWM pulse and the zero crossing on the negative slope of the voltage signal Va can be set to achieve a desired shorting duration ($T_{ON}$).

In some implementations, the voltage offset ($\delta_{th}$) of reference voltages $V_1$ and $V_2$ can be adjustable. For example, the voltage offset ($\delta_{th}$) can be the output of a digital to analog converter (DAC). The input to the DAC can be a digital output signal from the controller 802. For example, an adjustable voltage offset ($\delta_{th}$) may permit fine tuning of the ZVS points. For instance, decreasing the magnitude of the voltage offset ($\delta_{th}$) biases the control circuitry 806 towards switching closer to the actual zero crossing point of the applied voltage signal. Furthermore, decreasing the voltage offset ($\delta_{th}$) to zero or a negative value can place the control circuitry 806 into a hard switching mode.

In some implementations, the comparators 308a, 308b are referenced to ground. That is, the non-inverting inputs of comparators 308a, 308b are connected to ground, for example, as in FIG. 3. In some implementations, the comparators 308a, 308b can be referenced to a slightly positive voltage ($V_{GND}+\delta$). That is, the non-inverting inputs of comparators 308a, 308b can be connected to a slightly positive voltage ($V_{GND}+\delta$). In some examples, the $\delta$ voltage can be set to reduce the initial switching delay (e.g., that shown in FIG. 9A) and reduce the time required for the control circuitry 806 to generate an optimal reference voltage ($V_{int}$) for comparator 805a. In some examples, the $\delta$ voltage can be set to bias the control circuitry 806 more towards hard switching versus soft switching. Furthermore, the $\delta$ voltage can be either a preset value or adjustable.

The examples and implementations discussed above are described in reference to performing ZVS on the positive half of a voltage waveform. It should be understood that the implementations discussed can also perform ZVS on the negative half of a voltage waveform. To do so, the polarity of reference signals can be reversed and the connections to the input terminals of appropriate comparators can be switched. In addition, the connections to the input terminals of the comparators shown in the depicted circuits can be switched for use with falling edge triggered devices (e.g., flip-flops) instead of rising edge triggered devices.

In some examples, the control circuitry of each of the above described tunable capacitor circuits can be implemented as ZVS circuitry in other applications. For example, the control circuitry of any of the above described implementations can be used as ZVS control circuitry for various amplifiers or power supplies (e.g., class D or class E switching amplifiers). For example, the ZVS devices and methods described herein can be used to control the switch timing of amplifiers or power supplies to minimize power losses in the amplifier or power supply. Zero voltage amplifier switching may also reduce hard switching effects and electromagnetic interference effects in amplifiers.

For illustrative purposes, the foregoing description focuses on the use of devices, components, and methods in desktop wireless power transfer applications, e.g., power transfer to electronic devices such as laptops, smartphones, and other mobile electronic devices that are commonly placed on desktops, tabletops, and other user work surfaces.

More generally, however, it should be understood that devices that can receive power using the devices, components, and methods disclosed herein can include a wide range of electrical devices, and are not limited to those devices described for illustrative purposes herein. In general, any portable electronic device, such as a cell phone, keyboard, mouse, radio, camera, mobile handset, headset, watch, headphones, dongles, multifunction cards, food and drink accessories, and the like, and any workspace electronic devices such as printers, clocks, lamps, headphones, external drives, projectors, digital photo frames, additional displays, and the like, can receive power wirelessly using the devices, components, and methods disclosed herein. Furthermore, any electrical device, such as electric or hybrid vehicles, motorized wheel chairs, scooters, power tools, and the like, can receive power wirelessly using the devices, components, and methods disclosed herein. In addition, the devices, components, and methods disclosed herein may be used for applications outside of wireless power transfer, for example, power factor correction devices, handheld signal analyzers, and the like.

In this disclosure, certain circuit or system components such as capacitors, inductors, resistors, diodes, and switches, are referred to as circuit "components" or "elements." The disclosure also refers to series and parallel combinations of these components or elements as elements, networks, topologies, circuits, and the like. Further, combinations of capacitors, diodes, transistors, and/or switches are described. More generally, however, where a single component or a specific network of components is described herein, it should be understood that alternative embodiments may include networks for elements, alternative networks, and/or the like.

As used herein, the term "coupled" when referring to circuit or system components is used to describe an appropriate, wired or wireless, direct or indirect, connection between one or more components through which information or signals can be passed from one component to another.

As used herein, the term "direct connection" or "directly connected," refers to a direct connection between two elements where the elements are connected with no intervening active elements between them. The term "electrically connected" or "electrical connection," refers to an electrical connection between two elements where the elements are connected such that the elements have a common potential. In addition, a connection between a first component and a terminal of a second component means that there is a path between the first component and the terminal that does not pass through the second component.

The embodiments described herein merely serve to illustrate, but not limit, the features of the disclosure. Other embodiments are also within the scope of the disclosure.

What is claimed is:

1. A variable capacitance device comprising:
    a first capacitor comprising a first-capacitor first terminal and a first-capacitor second terminal, the first-capacitor first terminal electrically connected to a ground;
    a first switch comprising a first-switch first terminal, a first-switch second terminal, and a first-switch control terminal, the first-switch first terminal electrically connected to the first-capacitor first terminal, and the first-switch second terminal electrically connected to the first-capacitor second terminal;
    a first comparator comprising a first-comparator first input terminal electrically connected to the first-capacitor second terminal;
    a second capacitor comprising a second-capacitor first terminal and a second-capacitor second terminal, the second-capacitor first terminal electrically connected to the ground;
    a second switch comprising a second-switch first terminal, a second-switch second terminal, and a second-switch a control terminal, the second-switch first terminal electrically connected to the second-capacitor first terminal, and the second-switch second terminal electrically connected to the second-capacitor second terminal;
    a second comparator comprising a second-comparator first input terminal electrically connected to the second-capacitor second terminal; and
    control circuitry coupled with the first-switch control terminal, with the second-switch control terminal, with a first-comparator output terminal of the first comparator, and with a second-comparator output terminal of the second comparator,
    wherein the control circuitry is configured to adjust respective capacitances of the first and second capacitors by:
        detecting a zero voltage condition across the first switch based on an output signal of the first comparator, and, in response, cause a first control signal to be applied to the first-switch control terminal for a duration of time, wherein the first control signal causes the first switch to close; and
        detecting a zero voltage condition across the second switch based on an output signal of the second comparator, and, in response, cause a second control signal to be applied to the second-switch control terminal for the duration of time, wherein the second control signal causes the second switch to close.

2. The variable capacitance device of claim 1, wherein a capacitance of the device depends on the duration of time for which the first and second control signals are applied to the respective first-switch control terminal and second-switch control terminal.

3. The variable capacitance device of claim 1, wherein the first switch is a first transistor and the second switch is a second transistor.

4. The variable capacitance device of claim 1, wherein the control circuitry is configured to receive an input signal and, in response to receiving the input signal, change the duration of time for which the first and second control signals are applied to the respective first-switch control terminal and second-switch control terminal.

5. The variable capacitance device of claim 1, further comprising:
    a third comparator comprising a third-comparator first input terminal electrically connected to a first reference voltage and a third-comparator second input terminal electrically connected to the first-switch control terminal; and
    a fourth comparator comprising a fourth-comparator first input terminal electrically connected to a second reference voltage and a fourth-comparator second input terminal electrically connected to the second-switch control terminal;
    wherein the control circuitry is coupled with a third-comparator output terminal of the third comparator and a fourth-comparator output terminal of the fourth comparator, and the control circuitry is configured to:
        detect a first ON condition at the first-switch control terminal based on an output signal of the third comparator;
        determine a first time difference, the first time difference being a difference in time from detecting the zero voltage condition across the first switch and detecting the first ON condition at the first-switch control terminal;
        adjust a first timing of when the first control signal is applied to the first-switch control terminal so as to reduce the first time difference;
        detect a second ON condition at the second-switch control terminal based on an output signal of the fourth comparator;
        determine a second time difference, the second time difference being a difference in time from detecting the zero voltage condition across the second switch and detecting the second ON condition at the second-switch control terminal; and
        adjust a second timing of when the second control signal is applied to the second-switch control terminal so as to reduce the second time difference.

6. The variable capacitance device of claim 5, wherein the control circuitry comprises:
    a pulse width modulation (PWM) generator comprising a first output terminal electrically connected to the first-switch control terminal and a second output terminal electrically connected to the second-switch control terminal,
    wherein the first control signal is a first pulse width modulated signal and the second control signal is a second pulse width modulated signal, and
    wherein the control circuitry is configured to control characteristics of the first and second pulse width modulated signals.

7. The variable capacitance device of claim 6, wherein adjusting the timing of when the first and second control signals are applied to the respective first-switch control terminal and the second-switch control terminal comprises adjusting phases of the first and second pulse width modulated signals.

8. The variable capacitance device of claim 6, wherein the control circuitry is configured to receive an input signal and, in response to receiving the input signal, change the duration of time for which the first and second control signals are applied to the respective control terminals of the first switch and the second switch by adjusting respective duty cycles of the first and second pulse width modulated signals.

9. The variable capacitance device of claim 1, further comprising:
a third comparator comprising a third-comparator first input terminal electrically connected to a first reference voltage and a third-comparator second input terminal electrically connected to the first-switch control terminal; and
a fourth comparator comprising a fourth-comparator first input terminal electrically connected to a second reference voltage and a fourth-comparator second input terminal electrically connected to the second-switch control terminal; and
wherein the control circuitry comprises:
a controller;
a first counter coupled with the first-comparator output terminal, the third-comparator output terminal, and the controller, the first counter configured to:
start a first timer in response to receiving a zero voltage signal from the first comparator,
stop the first timer in response to receiving a first ON condition signal from the third comparator, and
send a signal indicating an elapsed time of the first timer to the controller; and
a second counter coupled with the second-comparator output terminal, the fourth-comparator output terminal, and the controller, the second counter configured to:
start a second timer in response to receiving a zero voltage signal from the second comparator,
stop the second timer in response to receiving a second ON condition signal from the fourth comparator, and
send a signal indicating an elapsed time of the second timer to the controller;
wherein the controller is configured to:
adjust, based on the first-time-difference signal, a first timing of when the first control signal is applied to the first-switch control terminal so as to reduce the first time difference; and
adjust, based on the second-time-difference signal, a second timing of when the second control signal is applied to the second-switch control terminal so as to reduce the second time difference.

10. The variable capacitance device of claim 9, wherein the control circuitry comprises:
a pulse width modulation (PWM) generator coupled with the controller, the PWM generator comprising a first output terminal electrically connected to the first-switch control terminal and a second output terminal electrically connected to the second-switch control terminal,
wherein the first control signal is a first pulse width modulated signal and the second control signal is a second pulse width modulated signal, and
wherein the controller is configured to control characteristics of the first and second pulse width modulated signals.

11. The variable capacitance device of claim 9, wherein the controller is one of: a microcontroller, a computer processor, a field programmable logic array (FPGA), or an application specific integrated circuit (ASIC).

12. The variable capacitance device of claim 1, further comprising:
a third comparator comprising a third-comparator first input terminal electrically connected to a first reference voltage and a third-comparator second input terminal electrically connected to the first-switch control terminal; and
a fourth comparator comprising a fourth-comparator first input terminal electrically connected to a second reference voltage and a fourth-comparator second input terminal electrically connected to the second-switch control terminal;
wherein detecting the zero voltage condition across the first switch based on an output signal of the first comparator, and, in response, causing the first control signal to be applied to the first-switch control terminal comprises:
determining a first phase difference between a first-comparator output signal and a third-comparator output signal,
generating a third reference voltage based the first phase difference, and
causing the first control signal to be applied to the first-switch control terminal upon detecting that a voltage signal at the first-switch second terminal has crossed a voltage value equal to the third reference voltage, and
wherein detecting the zero voltage condition across the second switch based on an output signal of the second comparator, and, in response, cause the second control signal to be applied to the second-switch control terminal comprises:
determining a second phase difference between a second-comparator output signal and a fourth-comparator output signal,
generating a fourth reference voltage based the second phase difference, and
causing the second control signal to be applied to the second-switch control terminal upon detecting that a voltage signal at the second-switch second terminal has crossed a voltage value equal to the fourth reference voltage.

13. The variable capacitance device of claim 12, wherein the control circuitry comprises:
a first phase detection circuit coupled with the first-comparator output terminal and a third-comparator output terminal of the third comparator;
a first integrator circuit coupled with the first phase detection circuit;
a fifth comparator comprising a fifth-comparator output terminal, a fifth-comparator first input terminal electrically connected to the first-capacitor second terminal, and a fifth-comparator second input terminal coupled with the first integrator circuit;
a first flip-flop comprising a first-flip-flop reset terminal, a first-flip-flop clock terminal electrically connected to the fifth-comparator output terminal, and a first-flip-flop output terminal electrically connected to the first-switch control terminal;
a second phase detection circuit coupled with the second-comparator output terminal and a fourth-comparator output terminal of the fourth comparator;
a second integrator circuit coupled with the second phase detection circuit;

a sixth comparator comprising a sixth-comparator output terminal, a sixth-comparator first input terminal electrically connected to the second-capacitor second terminal, and a sixth-comparator second input terminal coupled with the second integrator circuit;

a second flip-flop comprising a second-flip-flop reset terminal, a second-flip-flop clock terminal electrically connected to the sixth-comparator output terminal, and a second-flip-flop output terminal electrically connected to the second-switch control terminal; and a controller coupled with the first flip-flop and the second flip-flop and configured to provide a first reset signal to the first flip-flop after the duration of time and to provide a second reset signal to the second flip-flop after the duration of time.

14. The variable capacitance device of claim 13, wherein the controller is a pulse width modulation (PWM) generator, the first reset signal is a first pulse width modulated signal, and the second reset signal is a second pulse width modulated signal.

15. A wireless energy transfer system comprising:

a split coil resonator comprising a first winding magnetically coupled with a second winding, wherein the first winding comprises a first-winding terminal and a third-winding terminal, and wherein the second winding comprises a second-winding terminal and fourth-winding terminal;

a fixed impedance matching network coupled with the third-winding terminal of the first winding and the fourth-winding terminal of the second winding; and a variable capacitance device comprising:

a first capacitor comprising a first-capacitor first terminal and a first-capacitor second terminal, the first-capacitor first terminal electrically connected to a ground, and the first-capacitor second terminal electrically connected to a first-winding terminal of the first winding of the split coil resonator;

a first switch comprising a first-switch first terminal, a first-switch second terminal, and a first-switch control terminal, the first-switch first terminal electrically connected to the first-capacitor first terminal, and the first-switch second terminal electrically connected to the first-capacitor second terminal;

a second capacitor comprising a second-capacitor first terminal and a second-capacitor second terminal, the second-capacitor first terminal electrically connected to the ground, and the second-capacitor second terminal electrically connected to a second-winding terminal of the second winding of the split coil resonator;

a second switch comprising a second-switch first terminal, a second-switch second terminal, and a second-switch a control terminal, the second-switch first terminal electrically connected to the second-capacitor first terminal, and the second-switch second terminal electrically connected to the second-capacitor second terminal; and control circuitry coupled with the first-switch control terminal and with the second-switch control terminal, wherein the control circuitry is configured to adjust respective capacitances of the first and second capacitors by:

in response to detecting a zero voltage condition across the first switch, causing a first control signal to be applied to the first-switch control terminal for a duration of time, wherein the first control signal causes the first switch to close; and in response to detecting a zero voltage condition across the second switch, causing a second control signal to be applied to the second-switch control terminal for the duration of time, wherein the second control signal causes the second switch to close.

16. The wireless energy transfer system of claim 15, further comprising:

a third capacitor comprising a third-capacitor first terminal and a third-capacitor second terminal, the third-capacitor first terminal electrically connected to the first-winding terminal, and the third-capacitor second terminal electrically connected to the first-capacitor second terminal; and a fourth capacitor comprising a fourth-capacitor first terminal and a fourth-capacitor second terminal, the fourth-capacitor first terminal electrically connected to the second-winding terminal, and the fourth-capacitor second terminal electrically connected to the second-capacitor second terminal.

17. The wireless energy transfer system of claim 15, further comprising a third capacitor comprising a third-capacitor first terminal and a third-capacitor second terminal, the third-capacitor first terminal electrically connected to the first-winding terminal, and the third-capacitor second terminal electrically connected to the second-winding terminal.

18. The wireless energy transfer system of claim 15, wherein a capacitance of the variable capacitance device depends on the duration of time for which the first and second control signals are applied to the respective first-switch control terminal and second-switch control terminal.

* * * * *

UNITED STATES PATENT AND TRADEMARK OFFICE
CERTIFICATE OF CORRECTION

Page 1 of 1

PATENT NO. : 10,141,788 B2
APPLICATION NO. : 15/293443
DATED : November 27, 2018
INVENTOR(S) : Curt Karnstedt and Christopher Buenrostro It is certified that error appears in the above-identified patent and that said Letters Patent is hereby corrected as shown below:

In the Claims

Column 26
Line 24, in Claim 12, after "based" insert -- on --
Line 39, in Claim 12, after "based" insert -- on --

Signed and Sealed this
Thirtieth Day of July, 2019

Andrei Iancu
*Director of the United States Patent and Trademark Office*